(12) United States Patent
Yabuuchi et al.

(10) Patent No.: US 10,825,814 B2
(45) Date of Patent: Nov. 3, 2020

(54) SEMICONDUCTOR DEVICE

(71) Applicant: Renesas Electronics Corporation, Tokyo (JP)

(72) Inventors: Makoto Yabuuchi, Tokyo (JP); Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 64 days.

(21) Appl. No.: 16/287,570

(22) Filed: Feb. 27, 2019

(65) Prior Publication Data

US 2019/0198499 A1    Jun. 27, 2019

Related U.S. Application Data

(63) Continuation of application No. 15/545,270, filed as application No. PCT/JP2015/003172 on Jun. 24, 2015, now abandoned.

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823821* (2013.01); *H01L 21/823871* (2013.01);
(Continued)

(58) Field of Classification Search
CPC ............. H01L 27/0924; H01L 27/0928; H01L 23/528
See application file for complete search history.

(56) References Cited

U.S. PATENT DOCUMENTS 10,177,133 B2 * 1/2019 Young ................ H01L 27/0207
2010/0148219 A1   6/2010 Shimizu
(Continued)

FOREIGN PATENT DOCUMENTS

JP   2010-141187 A   6/2010
JP   2014-038898 A   2/2014
(Continued)

OTHER PUBLICATIONS

United States Office Action dated Oct. 30, 2018, in U.S. Appl. No. 15/545,270.
(Continued)

*Primary Examiner* — Mark V Prenty
(74) *Attorney, Agent, or Firm* — McGinn IP Law Group, PLLC

(57) ABSTRACT

A semiconductor device includes a semiconductor substrate, a first well region formed on the semiconductor substrate, a first fin integrally formed of the semiconductor substrate on the first well region and extended in a first direction in a plan view, a first electrode formed on the first fin via a first gate insulating film, and extended in a second direction crossing the first direction in the plan view, a tap region formed on the semiconductor substrate adjacent to the first well region in the second direction, and supplying a first potential to the first well region, a second fin integrally formed of the semiconductor substrate on the tap region and extended in the first direction in the plan view, and a first wiring layer formed on the second fin in a portion overlapping the tap region in the plan view.

10 Claims, 27 Drawing Sheets

(51) Int. Cl.
*H01L 23/528* (2006.01)
*H01L 21/8234* (2006.01)

(52) U.S. Cl.
CPC .... *H01L 21/823892* (2013.01); *H01L 23/528* (2013.01); *H01L 27/0928* (2013.01); *H01L 21/823475* (2013.01); *H01L 21/823493* (2013.01); *H01L 23/5286* (2013.01)

(56) References Cited

U.S. PATENT DOCUMENTS

| 2013/0126978 A1 | 5/2013 | Becker et al. |
| 2013/0193526 A1 | 8/2013 | Lo et al. |
| 2014/0110767 A1 | 4/2014 | Anderson et al. |
| 2014/0167172 A1 | 6/2014 | Chen et al. |
| 2014/0306296 A1 | 10/2014 | Jeon et al. |
| 2014/0339646 A1 | 11/2014 | Joshi et al. |
| 2018/0012891 A1 | 1/2018 | Yabuuchi et al. |

FOREIGN PATENT DOCUMENTS

| JP | 2014-063929 A | 4/2014 |
| JP | 2014-207445 A | 10/2014 |
| JP | 2014-531769 A | 11/2014 |

OTHER PUBLICATIONS

United States Office Action dated Apr. 17, 2018, in U.S. Appl. No. 15/545,270.
International Search Report (ISR) (PCT Form PCT/ISA/210), in PCT/JP2015/003172, dated Sep. 15, 2015.
Japanese Office Action dated Apr. 3, 2018 in Japanese Patent Application No. 2017-524147, with an English translation thereof.
Japanese Office Action dated Nov. 6, 2018, in counterpart Japanese Patent Application No. 2017-524147.
Extended European Search Report dated Jan. 2, 2019, in European counterpart Patent Application No. 15896254.8.

* cited by examiner

SEMICONDUCTOR DEVICE

The present application is a Continuation Application of U.S. patent application Ser. No. 15/545,270, filed on Jul. 20, 2017, which is based on International Application PCT/JP2015/003172, filed on Jun. 24, 2015, the entire contents of which are hereby incorporated by reference.

TECHNICAL FIELD

The present disclosure relates to a semiconductor device. For example, the present disclosure relates to a semiconductor device having a fin-type FET structure.

BACKGROUND ART

A planar FET structure is one of the typical MOSFET (Metal-Oxide-Semiconductor Field Effect Transistor) structures. In the planar FET structure, a source region, a drain region, and a channel region are planarly disposed on a substrate. PTL 1 discloses a semiconductor device having a planar FET structure. In the semiconductor device disclosed in PTL 1, a plurality of p-channel-type field effect transistors (PMOSs) and a plurality of n-channel-type field effect transistors (NMOSs) are respectively formed in an n-type well region and a p-type well region on a semiconductor substrate.

The PMOSs and NMOSs each include a gate electrode that is formed on the semiconductor substrate with a gate insulating film interposed therebetween. In the planar FET structure, a channel is controlled from above by the gate electrode on the semiconductor substrate. These MOSFETs are connected with a wire in a first layer above the gate electrode so as to constitute a desired circuit.

Further, on the semiconductor substrate, a diffusion layer for power feeding called a "tap" is formed so as to extend in one direction. The tap includes an n-well tap for supplying a power supply potential VDD to an n-type well region in which the PMOSs are formed, and a P-well tap for supplying a power supply potential VSS to the p-type well region in which the NMOSs are formed. The n-well tap is connected to one PMOS source region via the wire in the first layer, and the P-well tap is connected to one NMOS source region via the wire in the first layer.

CITATION LIST

Patent Literature

Japanese Unexamined Patent Application Publication No. 2010-141187

SUMMARY OF INVENTION

Technical Problem

In the planar FET structure described above, the gate electrode does not extend to the region in which the taps are formed. Accordingly, when semiconductor elements are connected so as to straddle the taps, there is a need to use a wire in a layer above the gate electrode. However, when the wire in the layer above the gate electrode is used to connect the semiconductor elements, there is a problem that the number of available wire tracks is reduced, which leads to congestion of wires and an increase in area of the semiconductor device.

Other problems to be solved by and novel features of the present disclosure become apparent from the following description and the accompanying drawings.

Solution to Problem

According to one embodiment, a semiconductor device includes: a first fin that is formed on a first well on a substrate and has the same conductivity type as that of the first well; a second fin that is formed on a second well and has a conductivity type different from that of the second well; and a first electrode connected to each of the first fin and the second fin.

Advantageous Effects of Invention

According to the one embodiment, it is possible to provide a semiconductor device including fins capable of alleviating congestion of wires and avoiding an increase in area of the semiconductor device.

DESCRIPTION OF EMBODIMENTS

Figure 1:
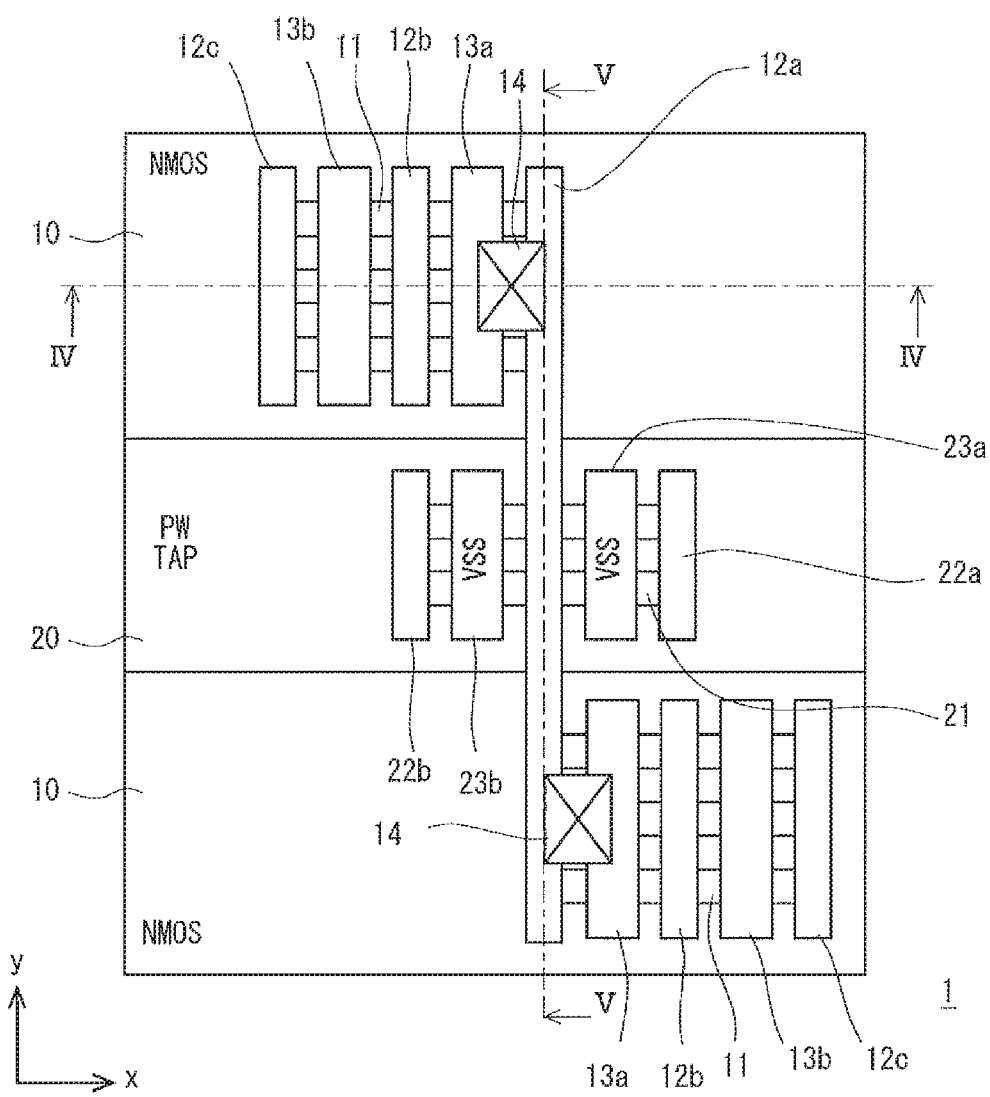
FIG. 1 is a plan view showing a configuration of a semiconductor device according to a first embodiment.

Embodiments will be described below with reference to the drawings. To clarify this description, the following description as well as the drawings have been abbreviated or simplified as appropriate. Specific numerical values described in the following embodiments are merely exemplary to facilitate understanding of the embodiments, and are not limited to these unless specified in particular. The same components are denoted by the same reference numerals throughout the drawings, and repeated descriptions thereof are omitted as appropriate.

In the following embodiments, a MOSFET (Metal Oxide Semiconductor Field Effect Transistor) which is representative of field effect transistors is abbreviated as MOS. A p-channel type MOSFET is abbreviated as PMOS, and an n-channel type MOSFET is abbreviated as NMOS. A diffusion layer for substrate contact for power feeding is hereinafter referred to as a tap.

Semiconductor devices according to the following embodiments may have a configuration in which the conductivity type (p-type or n-type) of a semiconductor substrate, a semiconductor layer, a diffusion layer (diffusion region), or the like is reversed. Accordingly, assuming that one of the conductivity types of n-type and p-type is a first-conductivity-type and the other one of the conductivity types is a second-conductivity-type, the p-type may be used as the first-conductivity-type and the n-type may be used as the second-conductivity-type. On the contrary, the n-type may be used as the first-conductivity-type and the p-type may be used as the second-conductivity-type.

Figure 26:
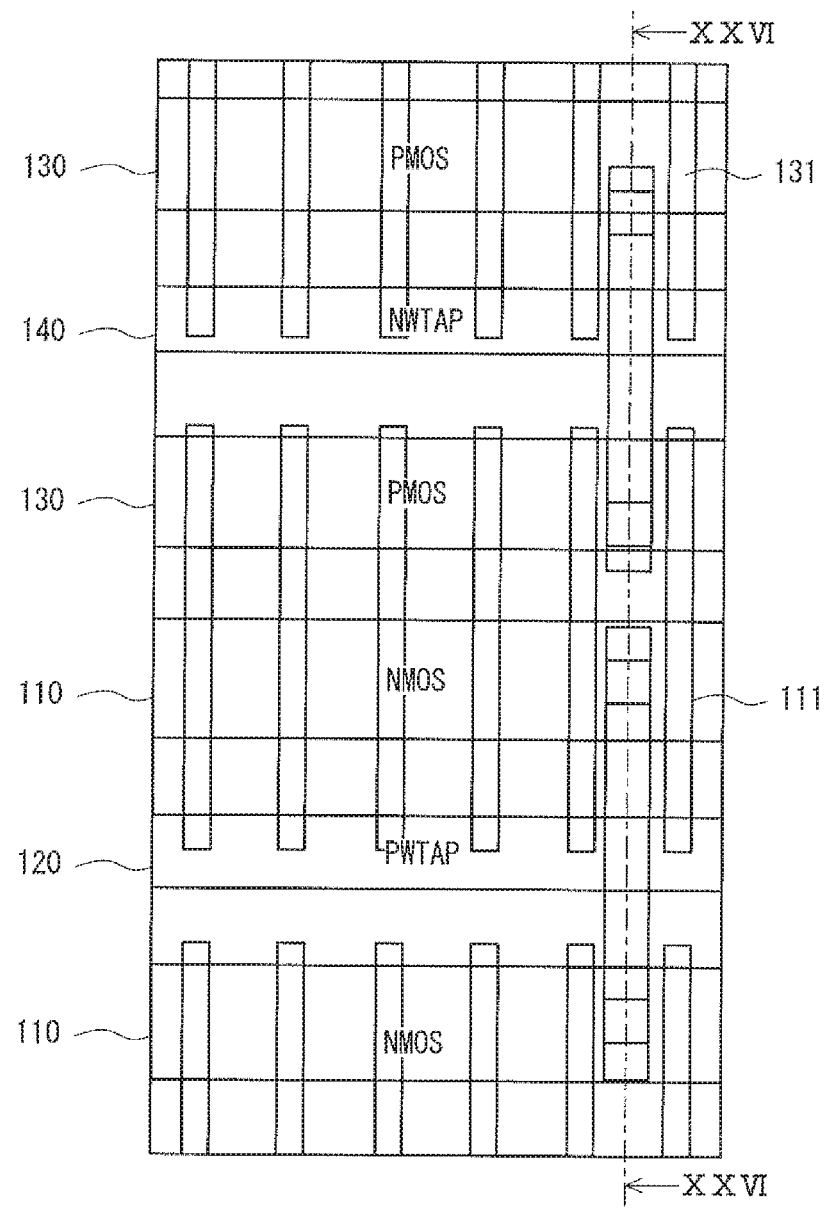
FIG. 26 is a plan view showing a configuration of a semiconductor device according to a comparative example.
Figure 27:
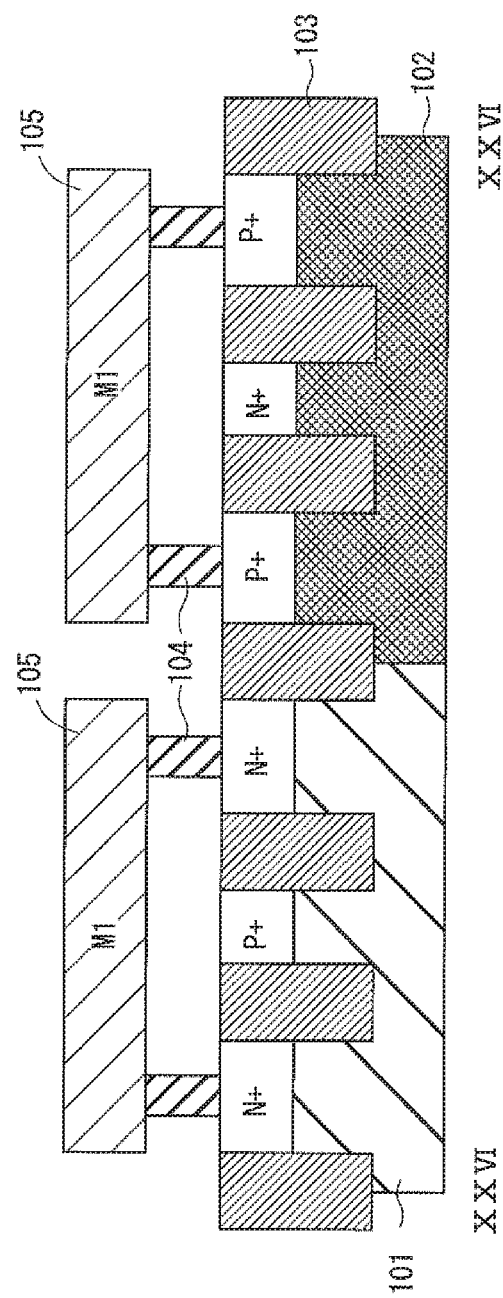
FIG. 27 is a sectional view taken along a line XXVI-XXVI of FIG. 26.

Prior to giving a description of semiconductor devices according to the embodiments, a semiconductor device according to a comparative example will be described with reference to FIGS. 26 and 27. FIG. 26 is a plan view showing the configuration of the semiconductor device according to the comparative example. FIG. 27 is a sectional view taken along a line XXVI-XXVI of FIG. 26. The comparative example shown in FIGS. 26 and 27 illustrates a semiconductor device having a planar FET structure. Note that in FIG. 27, the illustration of a gate insulating film and the like is omitted.

As shown in FIG. 27, in a semiconductor device 100 according to a comparative example, a p-type well region 101 and an n-type well region 102 are formed on a semiconductor substrate. Further, an element isolation film 103 is formed on the semiconductor substrate. The element isolation film 103 defines an active region in which semiconductor elements are formed.

As shown in FIG. 26, two n-channel type field effect transistor (NMOS) regions 110 are formed in the p-type well region 101. A plurality of NMOSs are formed in each NMOS region 110. The NMOSs are controlled by a gate electrode 111 which is formed above the NMOS region 110 with the gate insulating film interposed therebetween. Between the two NMOS regions 110, a PW (p-type well) TAP region 120 for supplying the power supply potential VSS to the p-type well region 101 is formed. The PWTAP region 120 is formed so as to extend in one direction between the two NMOS regions 110.

In the n-type well region 102, two p-channel field effect transistor (PMOS) regions 130 are formed. In each PMOS region 130, a plurality of PMOSs are formed. The PMOSs are controlled by a gate electrode 131 which is formed above the PMOS region 130 with the gate insulating film interposed therebetween. Between the two PMOS regions 110, a NW (n-type well) TAP region 120 for supplying the power supply potential VDD to the n-type well region 102 is formed. An NWTAP region 140 is formed so as to extend in one direction between the two PMOS regions 130.

A source region and a drain region of each NMOS are formed of a low-concentration n-type semiconductor region (not shown) and a high-concentration n-type semiconductor region N+, respectively, which regions are formed in the n-type well region 101. On the surface of the PWTAP region 120, a high-concentration p-type semiconductor region P+ formed in the p-type well region 101 is formed. A source region and a drain region of each PMOS are formed of a low-concentration n-type semiconductor region (not shown) and a high-concentration n-type semiconductor region P+, respectively, which regions are formed in the p-type well region 102. On the surface of the NWTAP region 140, the high-concentration n-type semiconductor region N+ formed in the n-type well region 102 is formed.

On these regions, an interlayer insulating film, which is not shown, is formed. The interlayer insulating film is provided with contact holes, and plugs 104 are formed in the respectively contact holes. The drains of two NMOSs which are disposed so as to face each other through the PWTAP region 120 are connected through an upper wiring layer 105. The drains of two PMOSs which are disposed so as to face each other through the NWTAP region 140 are connected through the upper wiring layer 105. The upper wiring layer 105 is formed of a first metallic layer M1 which is formed above the gate electrode.

The upper wiring layer 105 extends in a direction substantially perpendicular to the direction in which the PWTAP region 120 and the NWTAP region 140 extend. The upper wiring layer 105 is formed so as to straddle the PWTAP region 120 and the NWTAP region 140. Thus, in the semiconductor device according to the comparative example, the wiring layer formed in a layer above the gate electrode is used for connection of the PMOSs and NMOSs, which causes a problem that the number of available wire tracks is reduced, which leads to congestion of wires and an increase in area of the semiconductor device.

The planar FET as described above has problems such as deterioration in mobility due to an increase in the concentration of impurities, and an increase in leakage current, along with the microfabrication of elements in recent years. As a countermeasure against these problems, a fin-type FET is proposed. The fin-type FET has a structure in which a fin-type channel region formed on a semiconductor substrate is sandwiched by a U-shaped gate electrode, and the channel of the fin-type FET is controlled from three directions.

Accordingly, the leakage current, which is a problem inherent in the planar FET of the related art, can be effectively suppressed.

Thus, the conventional layout rules have greatly changed as the fin-type FET has been replaced by the planar FET. One example is that an electrode used as a gate of a transistor is formed on a diffusion layer for substrate contact (tap). The present inventors have studied how to alleviate the congestion of wiring layers, which is a problem inherent in the planar FET, by using the electrode formed on the diffusion layer for tap as a wire.

Semiconductor devices according to embodiments will be described below. The semiconductor devices according to the embodiments include transistors having a fin-type FET structure, and can be applied to microcomputers and System-on-a-chip (SoC) products.

First Embodiment

Figure 2:
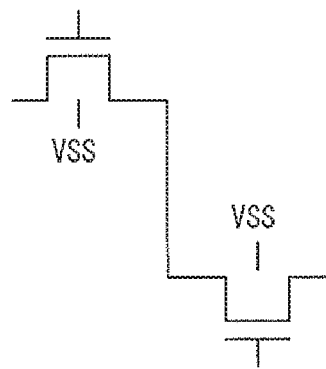
FIG. 2 is a circuit diagram showing the semiconductor device according to the first embodiment.
Figure 3:
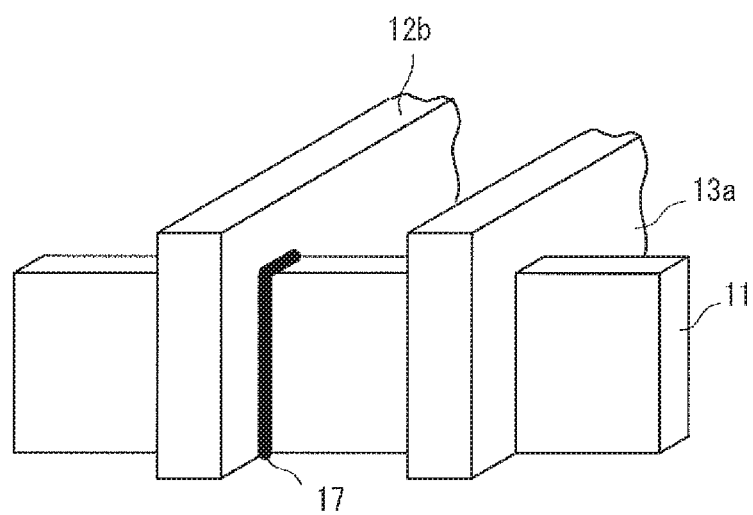
FIG. 3 is a perspective view illustrating a relationship between a fin, an electrode, and a wiring layer shown in FIG. 1.
Figure 4:
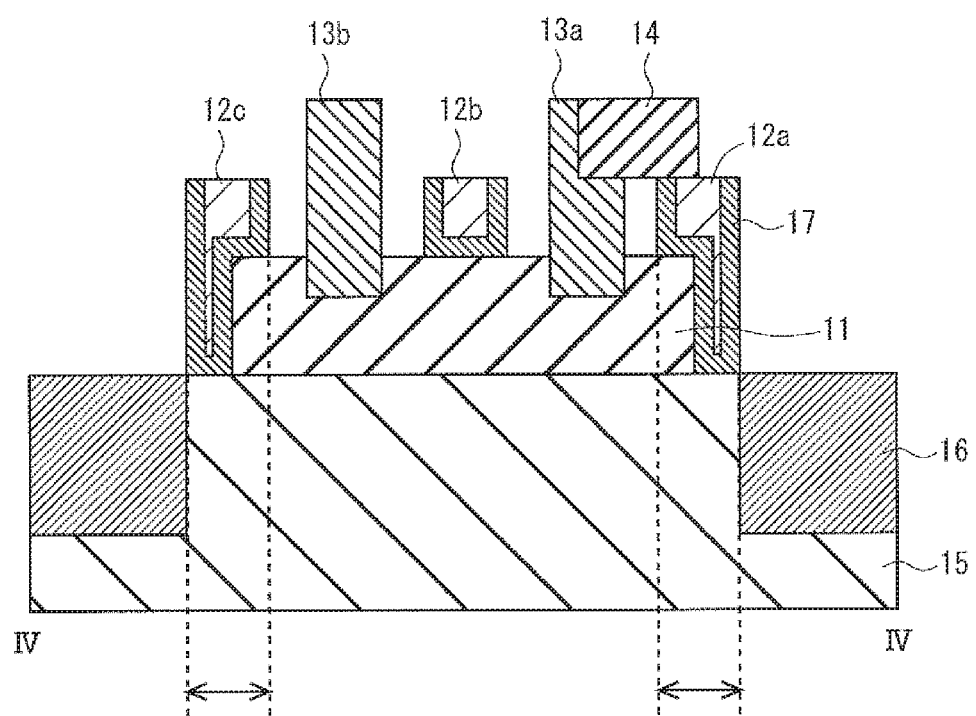
FIG. 4 is a sectional view taken along a line IV-IV of FIG. 1.
Figure 5:
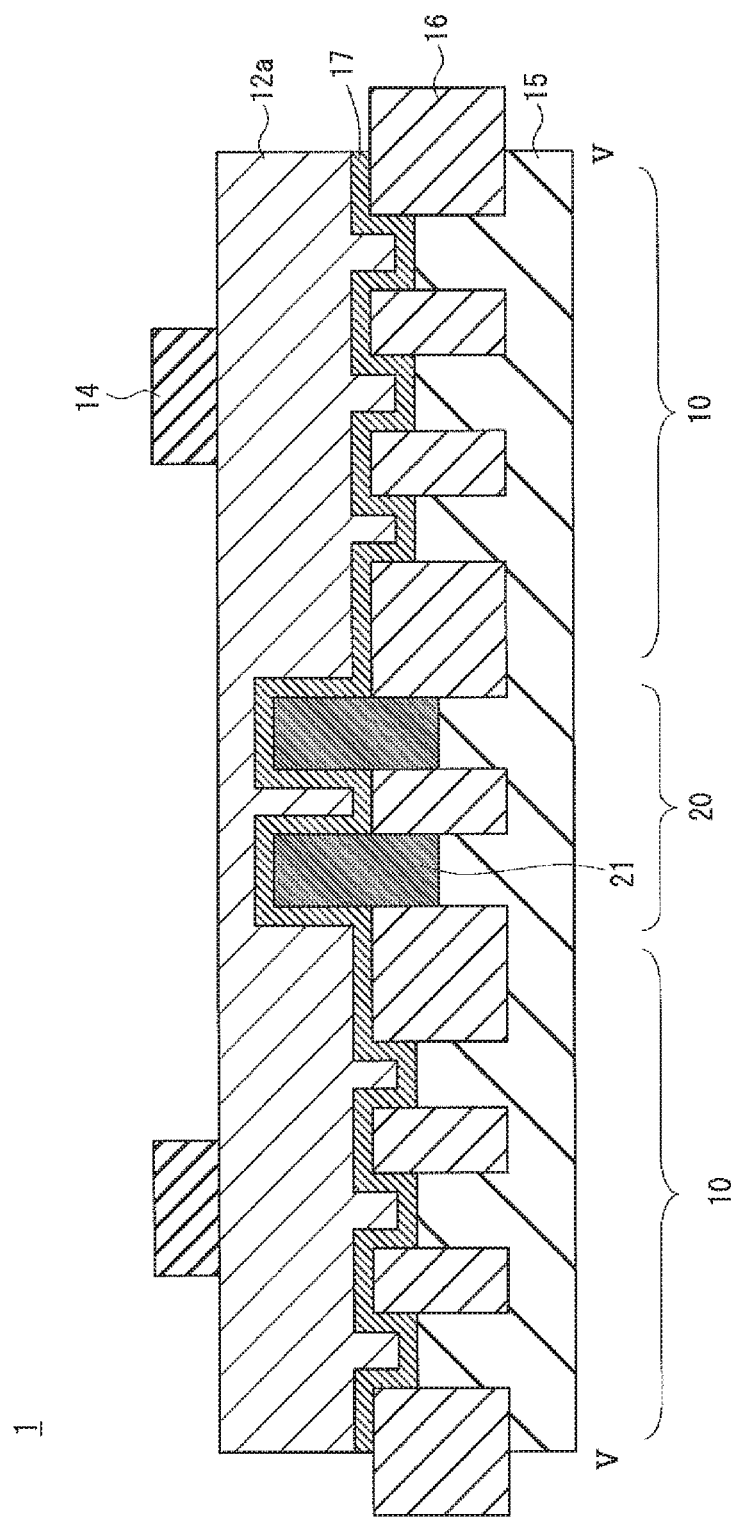
FIG. 5 is a sectional view taken along a line V-V of FIG. 1.

A semiconductor device 1 according to a first embodiment will be described with reference to FIGS. 1 to 5. FIG. 1 is a plan view showing the configuration of the semiconductor device 1. FIG. 2 is a circuit diagram showing the semiconductor device 1. FIG. 3 is a perspective view illustrating a relationship between a fin, an electrode, and a wiring layer shown in FIG. 1. FIG. 4 is a sectional view taken along a line IV-IV of FIG. 1. FIG. 5 is a sectional view taken along a line V-V of FIG. 1.

As shown in FIG. 1, the semiconductor device 1 includes two NMOS regions 10 and a PWTAP region 20. The two NMOS regions 10 are formed so as to face each other through the PWTAP region 20. As shown in FIGS. 4 and 5, a semiconductor substrate is provided with a p-type well region 15 in each NMOS region 10. Further, the semiconductor substrate is provided with the p-type well region 15 in the PWTAP region 20. Thus, in the first embodiment, the well regions formed in the NMOS regions 10 and the PWTAP region 20, respectively, have the same conductivity type.

The semiconductor substrate is provided with an element isolation film 16. The element isolation film 16 defines an active region in which semiconductor elements are formed, and has a function for preventing the elements formed on the semiconductor substrate from interfering with each other. The element isolation film 16 is formed by, for example, an STI (Shallow Trench Isolation) method in which a trench is formed in the semiconductor substrate and an insulating film, such as an oxide silicon film, is buried in the trench.

In the NMOS region 10, n-type fins 11 are formed on the p-type well region 15. The p-type well region 15 and the n-type fins 11 have different conductivity types. The n-type fins 11 each have a narrow strip shape (rectangular parallelepiped shape). In the example shown in FIG. 1, three n-type fins 11 are disposed at a predetermined interval. A direction in which the n-type fins 11 extend is referred to as an x-direction.

Three electrodes (an NM first electrode 12a, an NM second electrode 12b, and an NM third electrode 12c) are formed on each n-type fin 11. The three electrodes extend in a y-direction, which is perpendicular to the x-direction, and intersect with the three n-type fins 11. Accordingly, a gate insulating film 17 is formed between each of the n-type fins 11 and each of the three electrodes 12a to 12c. The gate insulating film 17 is formed of, for example, an oxide silicon film. The thickness of the gate insulating film 17 is equal to or less than 2 nm, and preferably, about 1 nm. The thickness of the element isolation film 16 is larger than that of the gate insulating film 17.

The relationship between the n-type fin 11 and the NM second electrode 12b will now be described with reference to FIG. 3. The NM second electrode 12b is formed so as to straddle the surface of the n-type fin 11 via the gate insulating film 17. A region covered with the NM second electrode 12b of the n-type fin 11 functions as a channel region. Specifically, each NMOS has a tri-gate structure in which both side surfaces and an upper surface of each n-type fin 11 serve as a channel region. The NM second electrode 12b is a gate electrode of the NMOS. A region which is not covered with the NM second electrode 12b of the n-type fin 11 serves as a source region or a drain region.

The three electrodes 12a to 12c are each formed of a conductive film, for example, a polysilicon film. An n-type conductive impurity, such as phosphorus or arsenic, may be introduced into the NM second electrode 12b which is the gate electrode of the NMOS on the p-type well region 15. Further, a gate metal material, such as tungsten, may be used as the material for the electrodes 12a to 12c.

Figure 25:
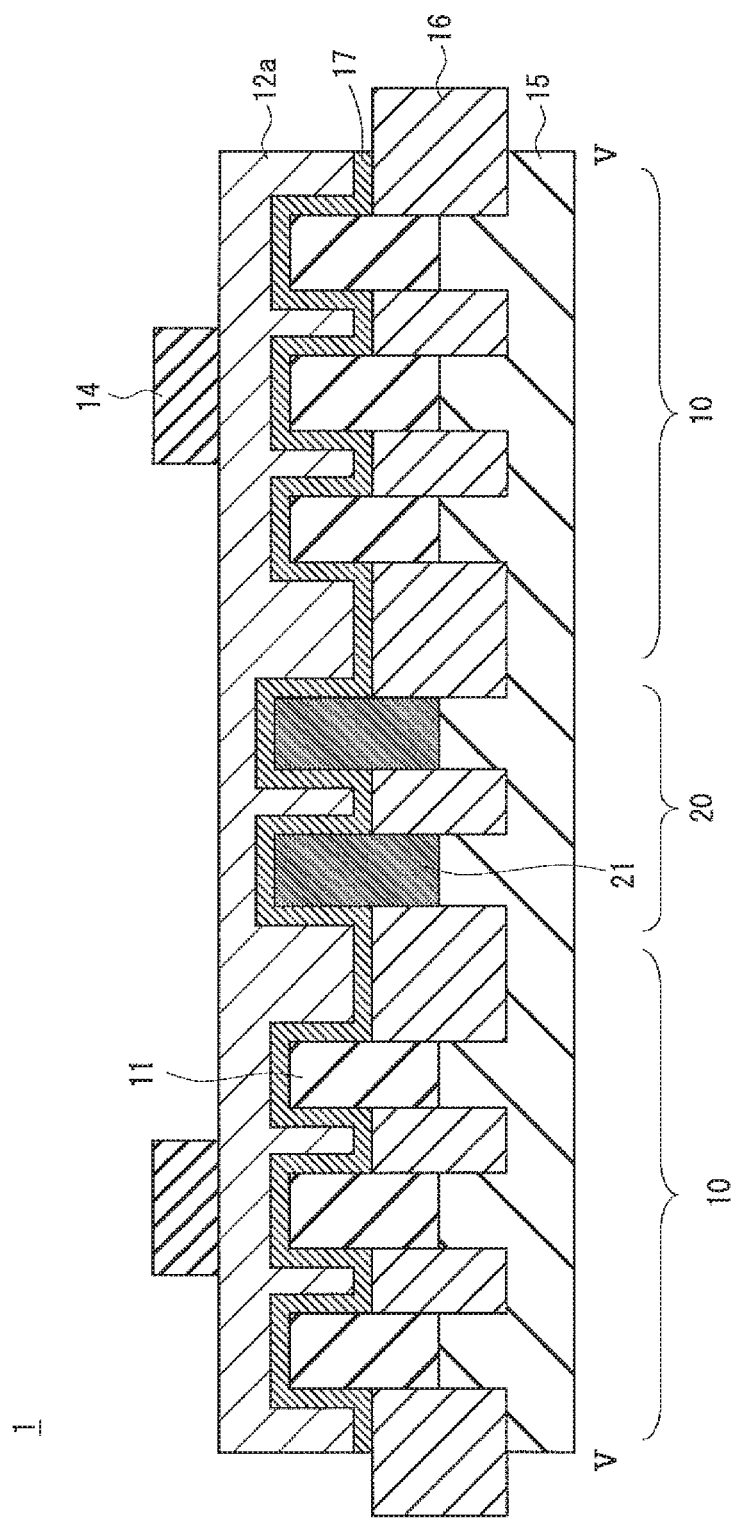
FIG. 25 is a sectional view taken along the line V-V when an NM first electrode and an NM second electrode shown in FIG. 1 are in contact with only an end of a side surface and an end of an upper surface in a longitudinal direction of an n-type fin.

As shown in FIG. 4, the NM first electrode 12a and the NM third electrode 12c are formed so as to cover an end of the n-type fin 11. Specifically, ends of the n-type fin 11 are disposed in the NM first electrode 12a and the NM third electrode 12c, respectively. In other words, the NM first electrode 12a and the NM third electrode 12c are in contact with an end of a side surface of the n-type fin 11 in the longitudinal direction, an end of the upper surface thereof, and a side surface thereof in the lateral direction. Note that the arrangement of the NM first electrode 12a and the NM third electrode 12c is not limited to this. For example, the NM first electrode 12a and the NM third electrode 12c may be disposed so as to be in contact with only the side surface of each n-type fin 11 in the lateral direction. Further, the NM first electrode 12a and the NM second electrode 12b may be formed in such a manner that the NM first electrode 12a and the NM second electrode 12b are in contact with only the end of the side surface of the n-type fin 11 in the longitudinal direction and the end of the upper surface thereof and are not in contact with the side surface thereof in the lateral direction. That is, an end of each n-type fin 11 may be located with a range indicated by a dashed line in FIG. 4. FIG. 25 shows a sectional view taken along the line V-V when the NM first electrode and the NM second electrode shown in FIG. 1 are in contact with only the end of the side surface of the n-type fin in the longitudinal direction and are not in contact with the side surface thereof in the lateral direction. As shown in FIG. 25, the side surface of each n-type fin 11 in the lateral direction is exposed from the NM first electrode 12a.

An NM first wiring layer 13a is formed between the NM first electrode 12a and the NM second electrode 12b. The NM first wiring layer 13a is connected to the NM first electrode 12a by the NM connection wiring layer 14. Further, an NM second wiring layer 13b is formed between the NM second electrode 12b and the NM third electrode 12c. Note that the NM first wiring layer 13a, the NM second wiring layer 13b, and the NM connection wiring layer 14 are each formed of a metallic layer M0, which is newly added in the fin-type FET, unlike the upper wiring layer 105 above the gate electrode described in the comparative example.

The metallic layer M0 is a layer formed between the gate and the metallic layer M1 in the comparative example. The NM first wiring layer 13a and the NM second wiring layer 13b are wiring layers vertically extending on the n-type fins 11 and are referred to as a metallic layer M0_V. The NM connection wiring layer 14 is a wire extending in the horizontal direction parallel to the n-type fins 11 and is referred to as a metallic layer M0_H. Accordingly, although not shown in the embodiment, the metal film M1 of the first layer to be connected through plugs is disposed above the metallic layer M0.

The metallic layer M0 is formed by, for example, burying a conductive film, which is mainly formed of a barrier metal film and copper, into a trench formed in an interlayer insulating film which is not shown. The barrier metal film is formed of tantalum, tantalum nitride, or a stacked layer film thereof. Note that the first wiring layer (metallic layer M1) and subsequent layers which are formed above the metallic layer M0 may also have the same structure. Note that the wiring layer disposed above the metallic layer M0 and the plugs may be integrally formed.

As shown in FIG. 3, the NM first wiring layer 13a is formed so as to straddle the surface of the n-type fin 11. Although not shown in FIG. 3, the NM second wiring layer 13b is also formed so as to straddle the surface of the n-type fin 11.

As shown in FIG. 5, in the PWTAP region 20, p-type fins 21 are formed on the p-type well region 15. The p-type well region 15 and the p-type fins 21 have the same conductivity type. The p-type fins 21 each have a narrow strip shape (rectangular parallelepiped shape), like the n-type fins 11. In the example shown in FIG. 1, two p-type fins 21 are disposed at a predetermined interval. The p-type fins 21 extend in the x-direction that is the same as the direction in which the n-type fins 11 extend.

On each p-type fin 21, three electrodes (the NM first electrode 12a, a PWTAP first electrode 22a, and a PWTAP second electrode 22b) are formed. The gate insulating film 17 is formed so as to cover the p-type fins 21. Accordingly, the gate insulating film 17 is formed between each of the p-type fins 21 and each of the three electrodes. The PWTAP first electrode 22a and the PWTAP second electrode 22b extend in the y-direction perpendicular to the x-direction, and intersect with the two p-type fins 21. The PWTAP first electrode 22a and the PWTAP second electrode 22b can also be formed with the same material as that for the three electrodes 12a to 12c.

Note that as shown in FIG. 5, the gate insulating film 17 is formed not only between each electrode and each fin, but also on the element isolation film between the fins. In other words, the gate insulating film 17 is formed in the entire surface below each of the three electrodes (the NM first electrode 12a, the PWTAP first electrode 22a, and the PWTAP second electrode 22b). The same holds true for the other embodiments.

The PWTAP first electrode 22a and the PWTAP second electrode 22b are formed so as to cover an end of each p-type fin 21. In the same manner as described above about the n-type fins 11 with reference to FIGS. 4 and 25, an end of each p-type fin 21 can be disposed within a range from the inner end of each of the PWTAP first electrode 22a and the PWTAP second electrode 22b to an outer end thereof.

The NM first electrode 12a extends so as to pass through the PWTAP region 20 from one of the NMOS regions 10 and reach the other one of the NMOS regions 10. The NM first electrode 12a is also connected to the NM first wiring layer 13a of the other one of the NMOS regions 10 via the NM connection wiring layer 14. Accordingly, the drains of two NMOS which are respectively formed at both ends of the PWTAP region 20 are connected together to form a circuit configuration shown in FIG. 2.

Specifically, the electrode (NM first electrode 12a) formed by the same process as that for the electrode (NM second electrode 12b) used as the gate of the NMOS in the PWTAP region 20 is used as a wire for transmitting signals of the NMOSs formed at both sides of the PWTAP region 20. Specifically, the NM first electrode 12a on the PWTAP region 20 is a wire connecting the upper and lower NMOSs in the PWTAP region 20, and serves as a signal node that is not a power supply. The NM first electrode 12a is connected to the semiconductor substrate by the p-type fins 21 in the PWTAP region 20.

A PWTAP first wiring layer 23a is disposed between the NM first electrode 12a and the PWTAP first electrode 22a. Further, the PWTAP second electrode 22b is disposed between the NM first electrode 12a and the PWTAP second electrode 22b. The PWTAP first wiring layer 23a and a PWTAP second wiring layer 23b are each connected to the power supply potential VSS. The power supply potential VSS can be used as a reference potential (ground potential) GND.

The p-type fins 21 each supply the p-type well region 15 with the power supply potential VSS, and the p-type well region 15 is fixed at a certain potential. The PWTAP first wiring layer 23a and the PWTAP second wiring layer 23b are formed of the metallic layer M0_V, unlike the upper wiring layer 105 of the comparative example.

Thus, in the semiconductor device according to the first embodiment, the NM first electrode 12a on the PWTAP region 20 can function as a wire for transmitting signals other than the power supply, without using the upper wiring layer, unlike in the comparative example. Accordingly, the congestion of wires can be prevented and the area of the semiconductor device can be reduced.

Second Embodiment

Figure 6:
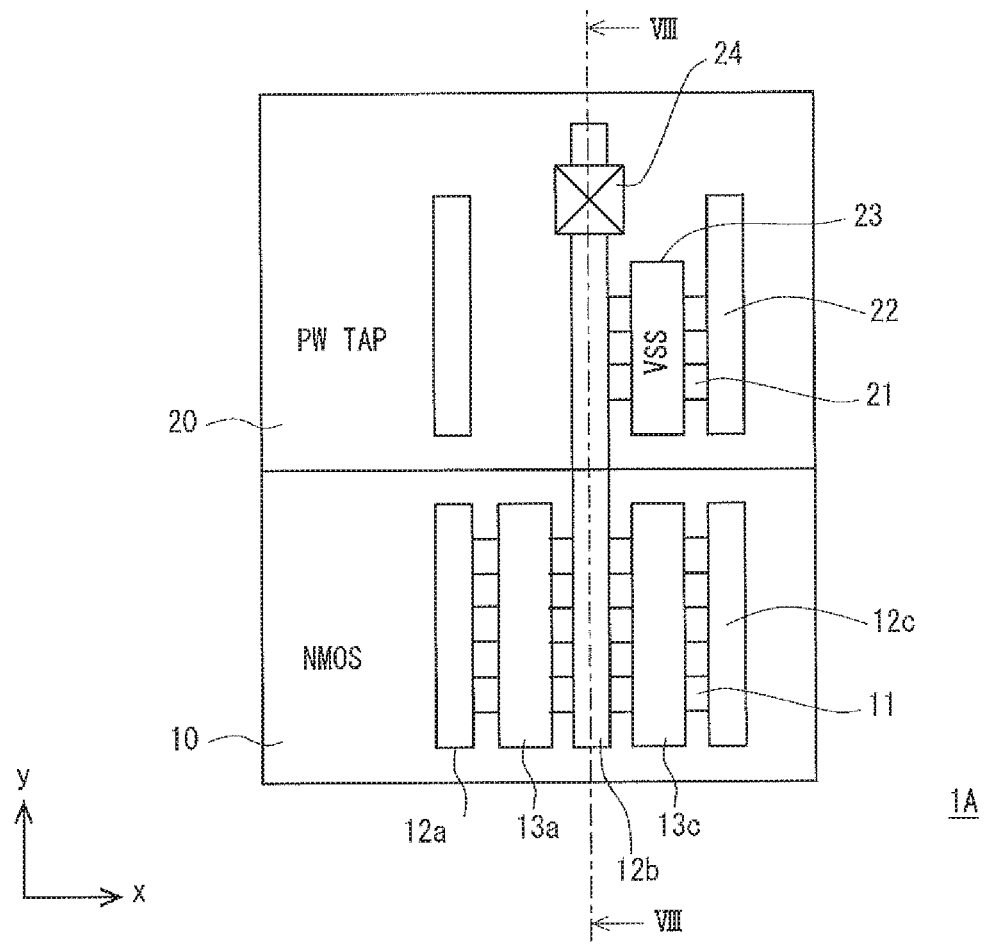
FIG. 6 is a plan view showing a configuration of a semiconductor device according to a second embodiment.
Figure 7:
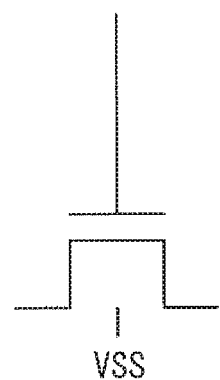
FIG. 7 is a circuit diagram showing the semiconductor device according to the second embodiment.
Figure 8:
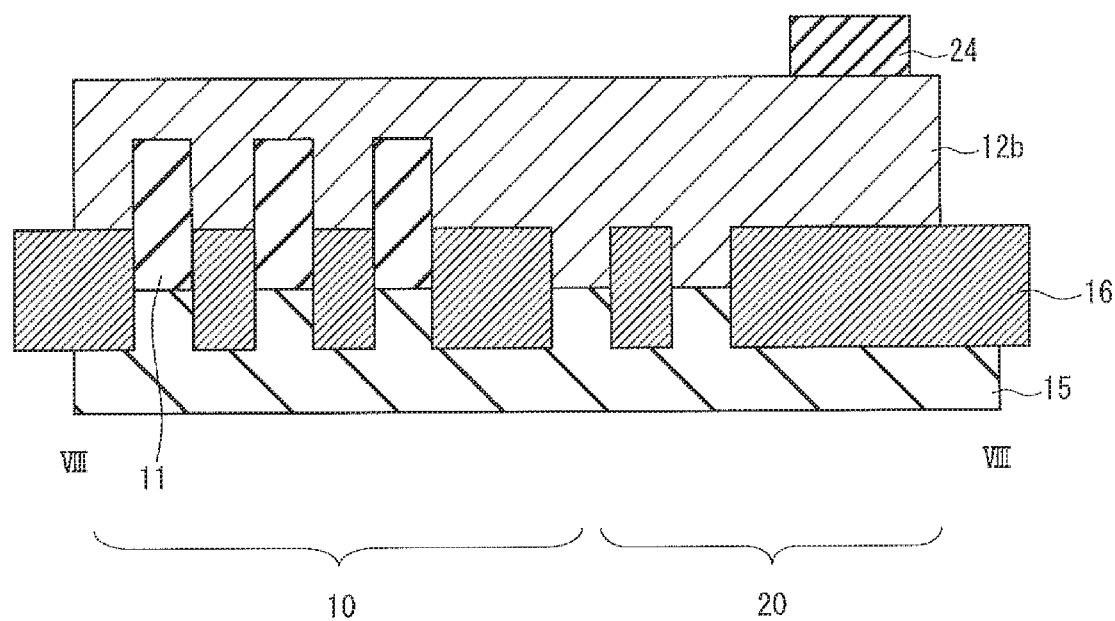
FIG. 8 is a sectional view taken along a line VIII-VIII of FIG. 6.

A semiconductor device 1A according to a second embodiment will be described with reference to FIGS. 6 to 8. FIG. 6 is a plan view showing the configuration of the semiconductor device 1A. FIG. 7 is a circuit diagram showing the semiconductor device 1A. FIG. 8 is a sectional view taken along a line VIII-VIII of FIG. 6.

As shown in FIG. 6, the semiconductor device 1A includes one NMOS region 10 and one PWTAP region 20. As shown in FIG. 8, in the NMOS region 10, the p-type well region 15 is formed on the semiconductor substrate. Further, in the PWTAP region 20, the p-type well region 15 is formed on the semiconductor substrate. Thus, in the second embodiment, the well regions respectively formed in the NMOS region 10 and the PWTAP region 20 have the same conductivity type. The element isolation film 16 that defines an active region is formed on the semiconductor substrate.

In the NMOS region 10, three n-type fins 11 are formed on the p-type well region 15 in such a manner that the n-type fins 11 extend in the x-direction. In the PWTAP region 20, two p-type fins 21 are formed on the p-type well region 15 in such a manner that the p-type fins 21 extend in the x-direction. In the example shown in FIG. 6, the length of each p-type fin 21 is substantially half the length of each n-type fin 11. Although not shown, the gate insulating film 17 is formed on the n-type fins 11 and the p-type fins 21 in such a manner that the gate insulating film covers these fins.

On each n-type fin 11, the three electrodes (the NM first electrode 12a, the NM second electrode 12b, and the NM third electrode 12c) are formed. The three electrodes are formed in such a manner that the electrodes extend in the y-direction perpendicular to the x-direction and straddle the three n-type fins 11. The NM second electrode 12b serves as the gate electrode of the NMOS. Further, the NM first electrode 12a and the NM third electrode 12c are formed so as to cover an end of each of the n-type fins 11.

In the second embodiment, the NM second electrode 12b serving as the gate electrode extends to the PWTAP region 20. The NM second electrode 12b is disposed so as to cover one end of each p-type fin 21. A PWTAP electrode 22 is formed on the other end of each p-type fin 21. The PWTAP electrode 22 is formed so as to cover the other end of each p-type fin 21. Note that as described above with reference to FIGS. 4 and 25, an end of each n-type fin 11 may be disposed between two side surfaces of the NM first electrode 12a and the NM third electrode 12c extending in the longitudinal direction. Further, an end of each p-type fin 21 may be disposed between two side surfaces of the PWTAP electrode 22 extending in the longitudinal direction, and between two side surfaces of the NM second electrode 12b extending in the longitudinal direction.

The NM first wiring layer 13a is formed between the NM first electrode 12a and the NM second electrode 12b. Further, the NM second wiring layer 13b is formed between the NM second electrode 12b and the NM third electrode 12c. In the PWTAP region 20, a PWTAP wiring layer 23 is formed between the PWTAP electrode 22 and the NM second electrode 12b. The PWTAP wiring layer 23 is connected to the power supply potential VSS.

A gate contact 24 is connected to the NM second electrode 12b of the PWTAP region 20. The gate contact 24 is formed at a position farther from the NMOS region 10 than the PWTAP wiring layer 23 for supplying the power supply potential VSS to the p-type well region 15 in the PWTAP region 20. The gate contact 24 is formed of the above-mentioned metallic layer M0_V. The semiconductor device according to the second embodiment has a circuit configuration shown in FIG. 7.

Thus, in the second embodiment, a voltage can be applied to the gate of the NMOS via the NM second electrode 12b on the PWTAP region 20. This allows the metallic layer for gate contact to be separated from the source and drain. Accordingly, the congestion of the wiring layer can be prevented and the area of the semiconductor device can be reduced.

Third Embodiment

Figure 9:
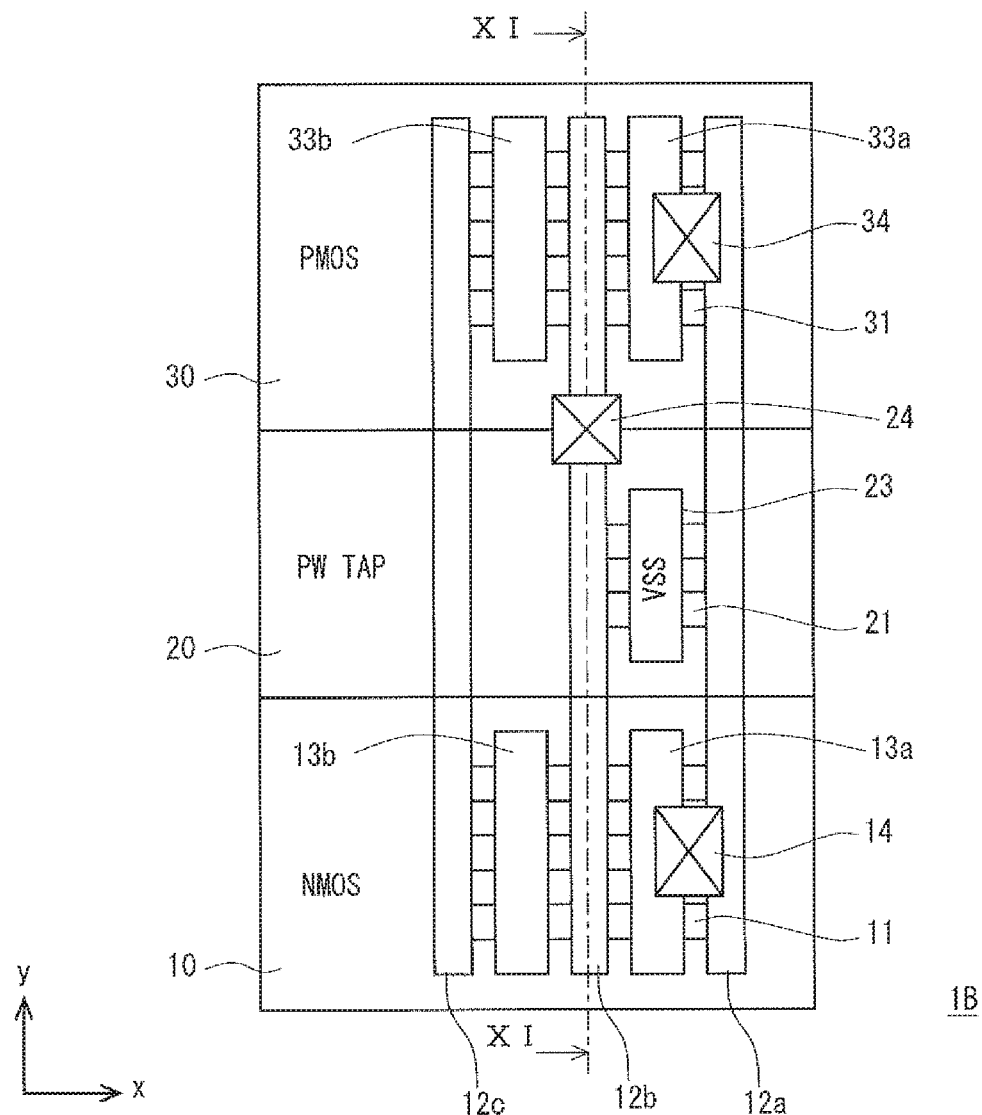
FIG. 9 is a plan view showing a configuration of a semiconductor device according to a third embodiment.
Figure 10:
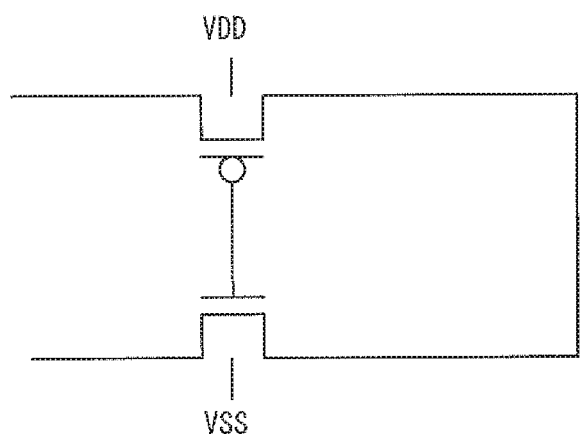
FIG. 10 is a circuit diagram showing the semiconductor device according to the third embodiment.
Figure 11:
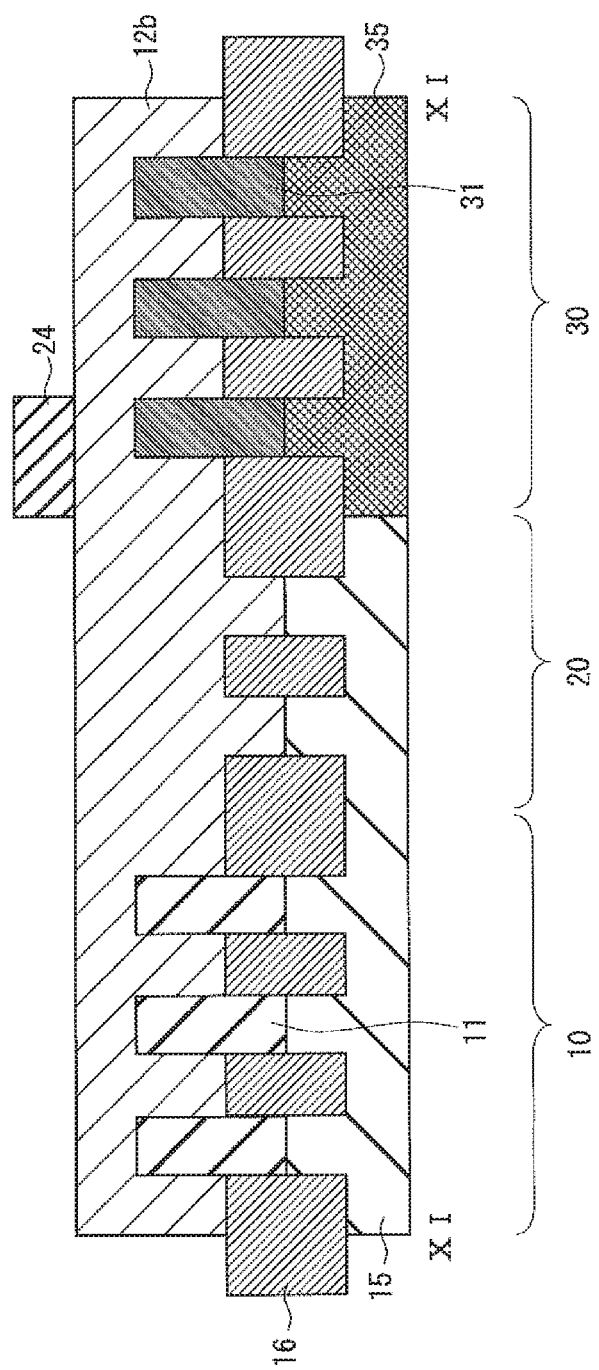
FIG. 11 is a sectional view taken along a line XI-XI of FIG. 9.

A semiconductor device 1B according to a third embodiment will be described with reference to FIGS. 9 to 11. FIG. 9 is a plan view showing the configuration of the semiconductor device 1B. FIG. 10 is a circuit diagram showing the semiconductor device 1B. FIG. 11 is a sectional view taken along a line XI-XI of FIG. 9.

As shown in FIG. 9, the semiconductor device 1B includes the NMOS region 10, the PWTAP region 20, and a PMOS region 30. As shown in FIG. 11, in the NMOS region 10, the p-type well region 15 is formed on the semiconductor substrate. In the PWTAP region 20, the p-type well region 15 is formed on the semiconductor substrate. In the PMOS region 30, an n-type well region 35 is formed on the semiconductor substrate. Thus, in the third embodiment, the well regions respectively formed in the NMOS region 10 and the PWTAP region 20 have the same conductivity type, and the conductivity type of the well regions formed in the NMOS region 10 and the PWTAP region 20 is different from that of the well region formed in the PMOS region 30. The element isolation film 16 that defines an active region is formed on the semiconductor substrate.

In the NMOS region 10, three n-type fins 11 are formed on the p-type well region 15 in such a manner that the n-type fins extend in the x-direction. In the PWTAP region 20, two p-type fins 21 are formed on the p-type well region 15 in such a manner that the p-type fins extend in the x-direction. In the PMOS region 30, three p-type fins 31 are formed on the n-type well region 35 in such a manner that the p-type fins extend in the x-direction. In the example shown in FIG. 9, the length of each n-type fin 11 is substantially the same as the length of each p-type fin 31. The length of each p-type fin 21 is substantially half the length of each of the n-type fins 11 and the p-type fins 31. Although not shown, the gate insulating film 17 is formed on the n-type fins 11, the p-type fins 21, and the p-type fins 31 in such a manner that the gate insulating film covers these fins.

On the n-type fins 11, three electrodes (the NM first electrode 12a, the NM second electrode 12b, and the NM third electrode 12c) are formed. The three electrodes extend in the y-direction perpendicular to the x-direction, and are formed so as to straddle the three n-type fins 11. The NM second electrode 12b serves as the gate electrode of the NMOS. The NM first electrode 12a and the NM third electrode 12c are formed so as to cover an end of each n-type fin 11.

In the third embodiment, three electrodes (the NM first electrode 12a, the NM second electrode 12b, and the NM third electrode 12c) extend from the NMOS region 10 through the PWTAP region 20 and reach the PMOS region 30. The NM first electrode 12a is disposed so as to cover the other end of each p-type fin 21 and one end of each p-type fin 31. The NM second electrode 12b is disposed so as to cover one end of each p-type fin 21 and straddle the p-type fins 31. The NM second electrode 12b serves as the gate electrode of the NMOS and also serves as the gate electrode of the PMOS.

The NM third electrode 12c is disposed so as to cover the other end of each p-type fin 31. An end of each n-type fin 11 and an end of each p-type fin 31 may be disposed between two side surfaces of each of the NM first electrode 12a and the NM third electrode 12c extending in the longitudinal direction. An end of each p-type fin 21 may be disposed between two side surfaces of each of the NM second electrode 12b and the NM third electrode 12c extending in the longitudinal direction.

In the NMOS region 10, the NM first wiring layer 13a is formed between the NM first electrode 12a and the NM second electrode 12b. The NM first electrode 12a is connected to the NM first wiring layer 13a via the NM connection wiring layer 14. In the NMOS region 10, the NM second wiring layer 13b is formed between the NM second electrode 12b and the NM third electrode 12c. In the PWTAP region 20, the PWTAP wiring layer 23 is formed between the NM first electrode 12a and the NM second electrode 12b. The PWTAP wiring layer 23 is connected to the power supply potential VSS.

In the PMOS region 30, a PM first wiring layer 33a is formed between the NM first electrode 12a and the NM second electrode 12b. The NM first electrode 12a is connected to the PM first wiring layer 33a via a PM connection wiring layer 34. In the PMOS region 30, a PM second wiring layer 33b is formed between the NM second electrode 12b and the NM third electrode 12c.

The gate contact 24 is connected to the NM second electrode 12b. The gate contact 24 is formed on a boundary between the PWTAP region 20 and the PMOS region 30. Accordingly, the semiconductor device 1B has a circuit configuration shown in FIG. 10 in which the gate electrodes of the NMOS and PMOS, which are formed at both sides of the PWTAP region 20, are connected to each other and the drains thereof are connected to each other.

Thus, in third embodiment, the NM first electrode 12*a* on the PWTAP region 20 can function as a wire for transmitting signals other than the power supply. Further, the metallic layer for gate contact can be separated from the source and drain. Consequently, the congestion of wires can be prevented and the area of the semiconductor device can be reduced.

Note that in the third embodiment, the diffusion layer (p-type fin 21) is disconnected below the NM first electrode 12*a* and the NM second electrode 12*b* in the PWTAP region 20. Specifically, the p-type fins 21 are disposed within a range from the NM first electrode 12*a* to the NM second electrode 12*b*. Accordingly, when the third embodiment is compared with a fourth embodiment described below, the third embodiment has another advantage that the PWTAP wiring layer 23 connected to the power supply potential VSS is not formed on the left side of the NM second electrode 12*b*, so that the parasitic capacitance in this area can be reduced. Note that this advantage is similar to that in the PWTAP region 20 shown in FIG. 6.

Fourth Embodiment

Figure 12:
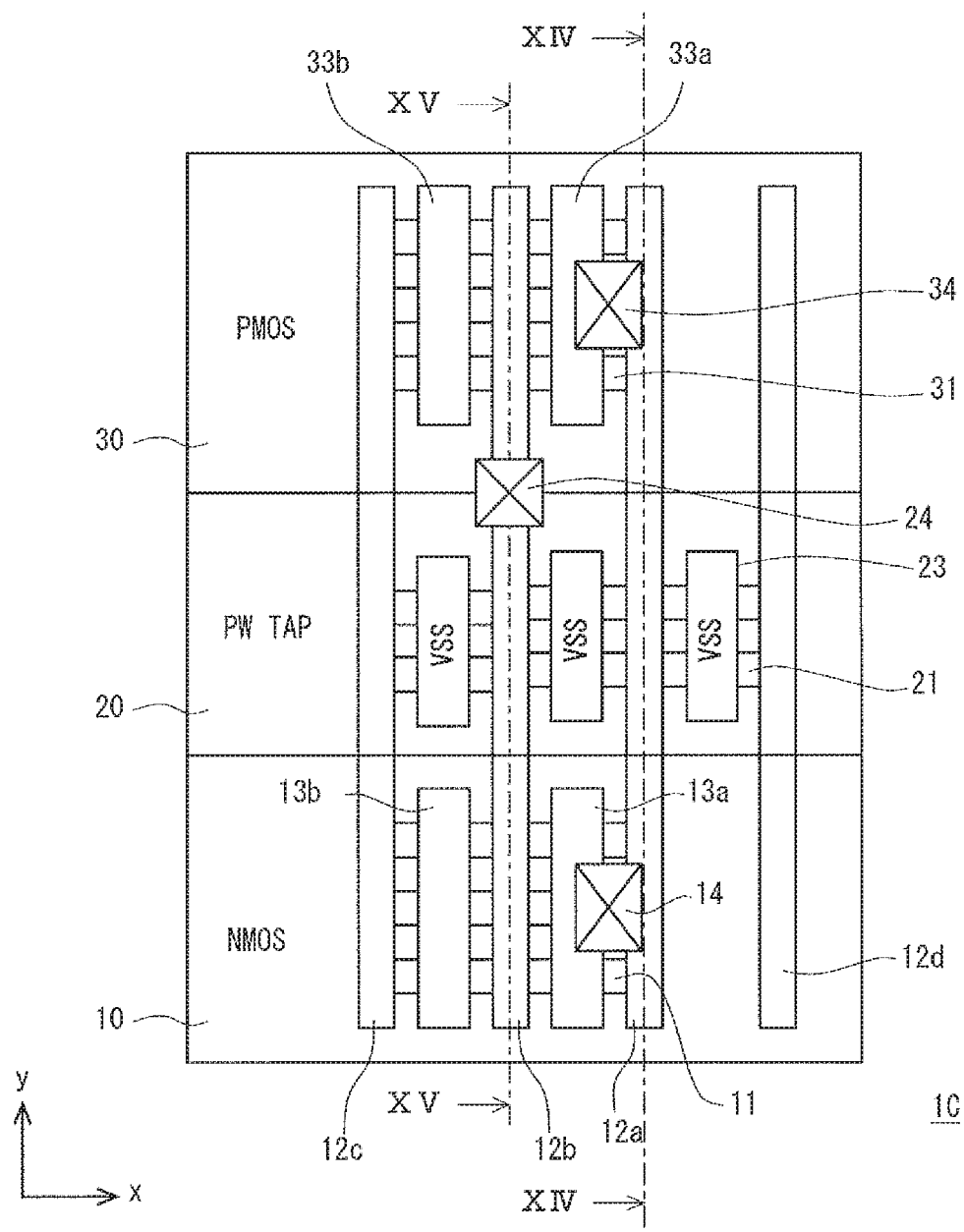
FIG. 12 is a plan view showing a configuration of a semiconductor device according to a fourth embodiment.
Figure 13:
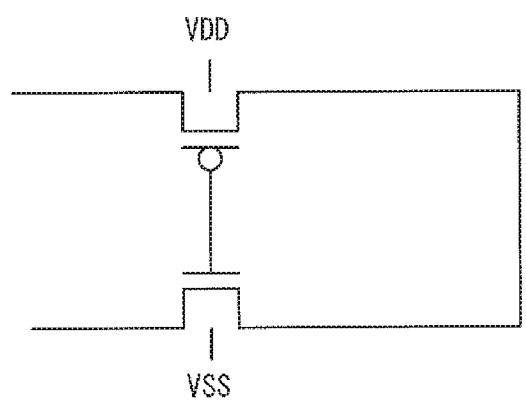
FIG. 13 is a circuit diagram showing the semiconductor device according to the fourth embodiment.
Figure 14:
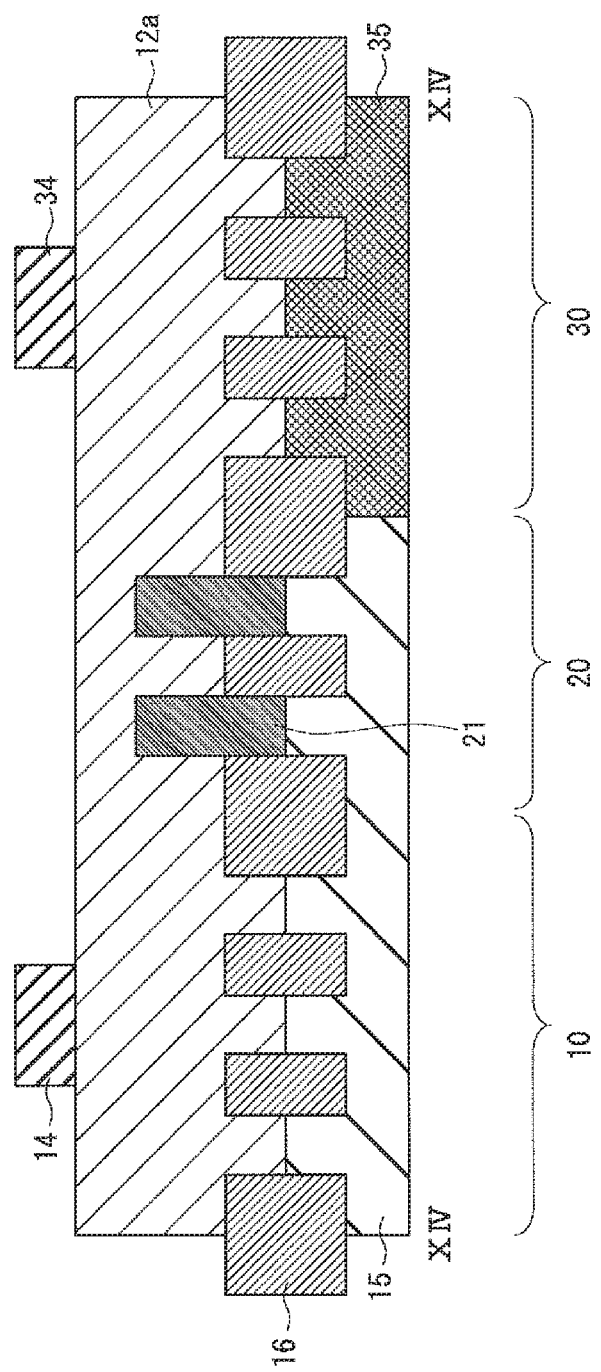
FIG. 14 is a sectional view taken along a line XVI-XVI of FIG. 12.
Figure 15:
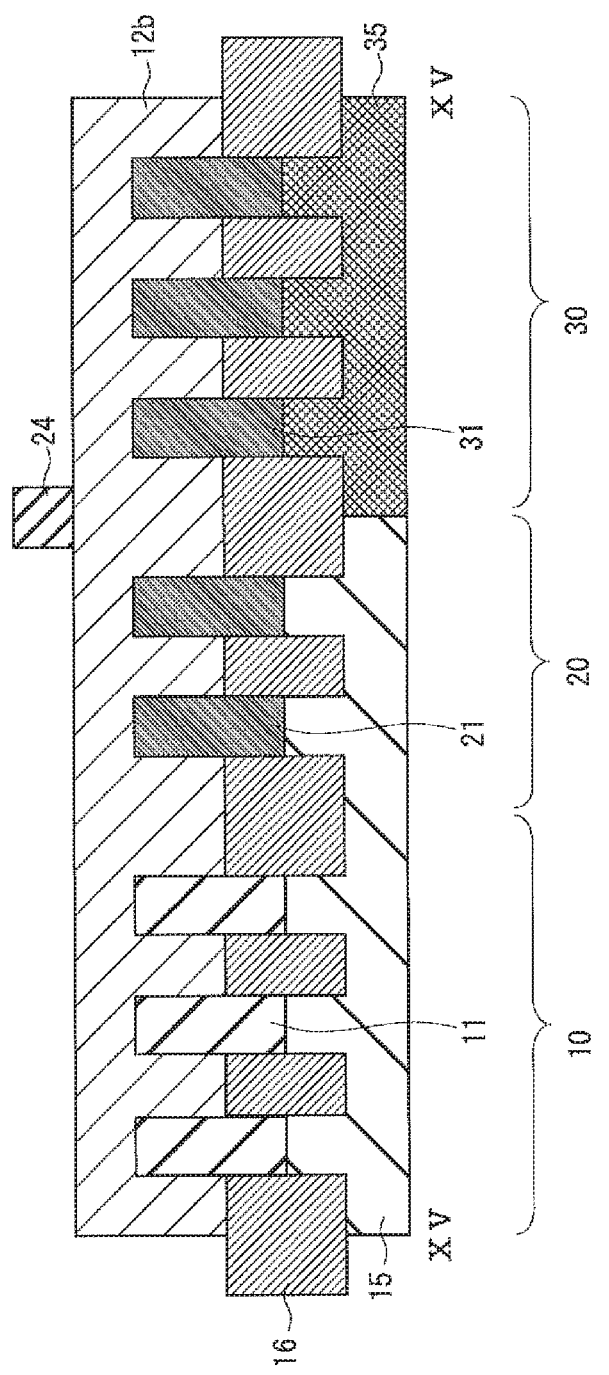
FIG. 15 is a sectional view taken along a line XV-XV of FIG. 12.

A semiconductor device 1C according to a fourth embodiment will be described with reference to FIGS. 12 to 15. FIG. 12 is a plan view showing the configuration of the semiconductor device 1C. FIG. 13 is a circuit diagram showing the semiconductor device 1C. FIG. 14 is a sectional view taken along a line XIV-XIV of FIG. 12. FIG. 15 is a sectional view taken along a line XV-XV shown in FIG. 12. The semiconductor device 1C according to the fourth embodiment is a modified example of the semiconductor device 1B according to the third embodiment.

As shown in FIG. 12, the semiconductor device 1C includes an NM fourth electrode 12*d* in addition to the three electrodes 12*a* to 12*c* of the semiconductor device 1B. The NM fourth electrode 12*d* is disposed on the opposite side of the NM second electrode 12*b* of the NM first electrode 12*a* in the x-direction. The four electrodes 12*a* to 12*d* are disposed side by side in the x-direction at predetermined intervals. The four electrodes 12*a* to 12*d* extend from the NMOS region 10 through the PWTAP region 20 and reach the PMOS region 30. The NM first electrode 12*a* connects the drain of the NMOS and the drain of the PMOS. The NM second electrode 12*b* serves as the gate electrode of each of the NMOS and the PMOS. Accordingly, the semiconductor device 1C has a circuit configuration shown in FIG. 13.

Unlike the semiconductor device 1B, in the semiconductor device 1C, the p-type fins 21 are not disconnected below the NM first electrode 12*a*, which connects the drains of the NMOS and the PMOS, and the NM second electrode 12*b* serving as the gate electrode each of of the NMOS and the PMOS. Specifically, the p-type fins 21 each extend from the NM third electrode 12*c* through the area below the NM second electrode 12*b* and the NM first electrode 12*a* and reach the NM fourth electrode 12*d*.

In the PWTAP region 20, the PWTAP wiring layer 23 is disposed between the NM first electrode 12*a* and the NM fourth electrode 12*d*. The PWTAP wiring layer 23 is connected to the power supply potential VSS. Although not shown in FIGS. 14 and 15, the gate insulating film 17 is formed on the n-type fins 11, the p-type fins 21, and the p-type fins 31 in such a manner that the gate insulating film covers these fins.

Thus, also in the fourth embodiment, the congestion of lead-in metal wires for drain contact and lead-in metal wires for gate contact can be prevented and the area of the semiconductor device can be reduced.

Fifth Embodiment

Figure 16:
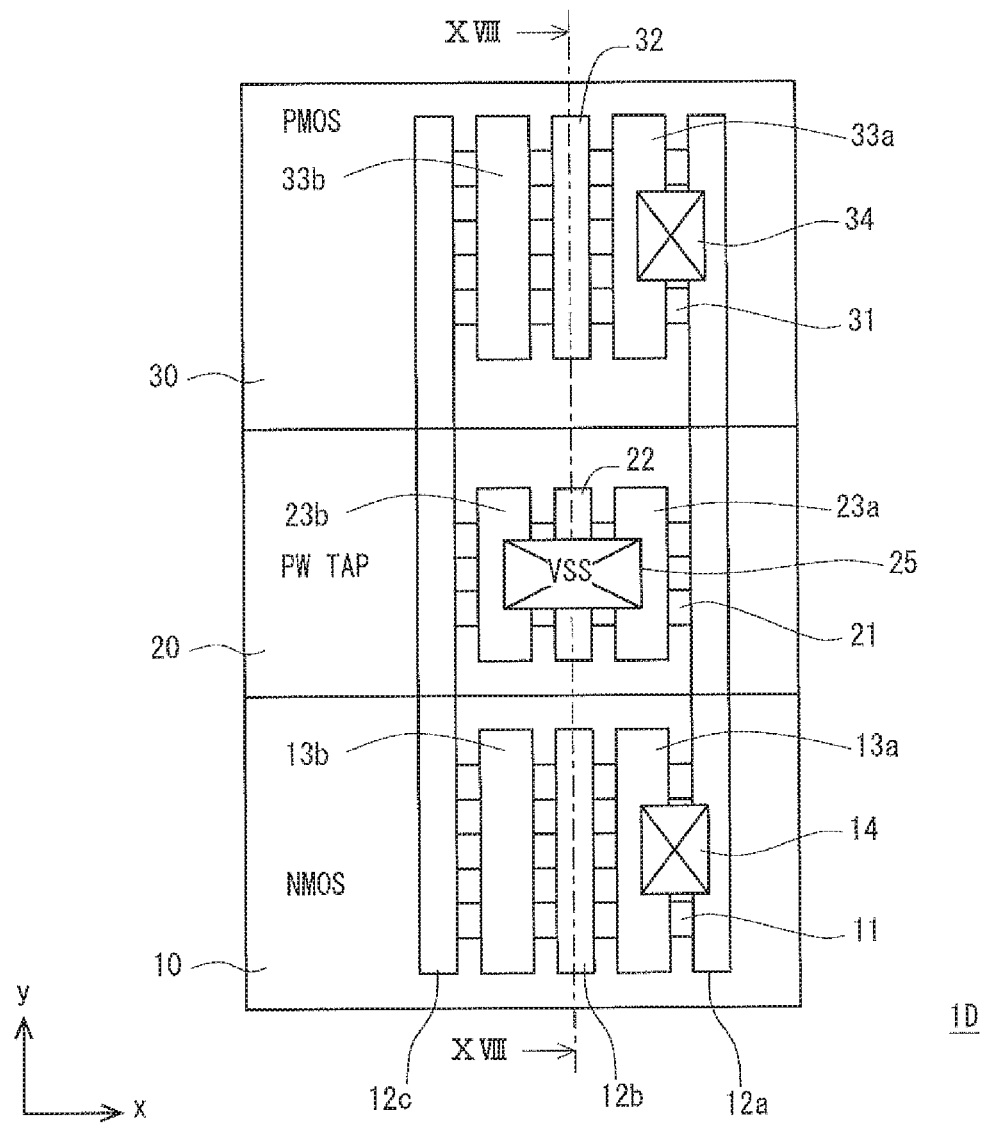
FIG. 16 is a plan view showing a configuration of a semiconductor device according to a fifth embodiment.
Figure 17:
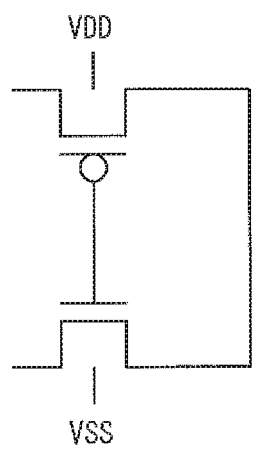
FIG. 17 is a circuit diagram showing the semiconductor device according to the fifth embodiment.
Figure 18:
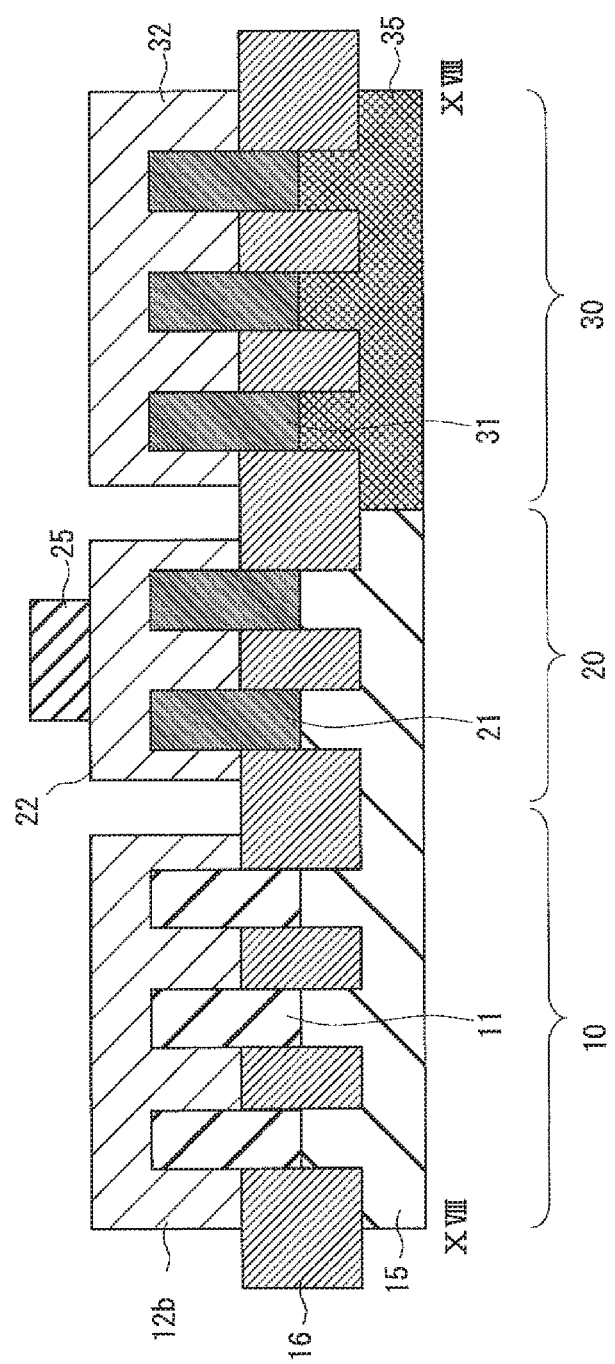
FIG. 18 is a sectional view taken along a line XVIII-XVIII of FIG. 16.

A semiconductor device 1D according to a fifth embodiment will be described with reference to FIGS. 16 to 18. FIG. 16 is a plan view showing the configuration of the semiconductor device 1D. FIG. 17 is a circuit diagram showing the semiconductor device 1D. FIG. 18 is a sectional view taken along a line XVIII-XVIII in FIG. 16.

In the NMOS region 10, three n-type fins 11 are formed on the p-type well region 15 so as to extend in the x-direction. In the PWTAP region 20, two p-type fins 21 are formed on the p-type well region 15 so as to extend in the x-direction. In the PMOS region 30, three p-type fins 31 are formed on the n-type well region 35 so as to extend in the x-direction. In the example shown in FIG. 16, the n-type fins 11, the p-type fins 21, and the p-type fins 31 have the same length. Although not shown, the gate insulating film 17 is formed on the n-type fins 11, the p-type fins 21, and the p-type fins 31 in such a manner that the gate insulating film covers these fins.

On each n-type fin 11, three electrodes (the NM first electrode 12*a*, the NM second electrode 12*b*, and the NM third electrode 12*c*) are formed. The three electrodes are formed so as to extend in the y-direction perpendicular to the x-direction and straddle the three n-type fins 11. The NM second electrode 12*b* serves as the gate electrode of the NMOS. The NM first electrode 12*a* and the NM third electrode 12*c* are formed so as to cover an end of each n-type fin 11.

In the fifth embodiment, the NM first electrode 12*a* and the NM third electrode 12*c* extend from the NMOS region 10 through the PWTAP region 20 and reach the PMOS region 30. The NM first electrode 12*a* covers one end of each of the p-type fins 21 and the p-type fins 31. The NM third electrode 12*c* covers the other end of each of the p-type fins 21 and the p-type fins 31. As described above, the positions of ends of each of the n-type fins 11, the p-type fins 21, and the p-type fins 31 are not particularly limited, as long as the positions are located between two side surfaces of the NM first electrode 12*a* or the NM third electrode 12*c* extending in the longitudinal direction as described above.

In the NMOS region 10, the NM first wiring layer 13*a* is formed between the NM first electrode 12*a* and the NM second electrode 12*b*. The NM first electrode 12*a* is connected to the NM first wiring layer 13*a* via the NM connection wiring layer 14. In the NMOS region 10, the NM second wiring layer 13*b* is formed between the NM second electrode 12*b* and the NM third electrode 12*c*.

In the PWTAP region 20, each PWTAP electrode 22 is formed so as to straddle a substantially central part of each p-type fin 21. Although not shown in FIG. 18, the gate insulating film 17 is formed between the p-type fins 21 and the PWTAP electrode 22. The PWTAP first wiring layer 23*a* is formed between the PWTAP electrode 22 and the NM first electrode 12*a*, and the PWTAP second wiring layer 23*b* is formed between the PWTAP electrode 22 and the NM third electrode 12*c*. The PWTAP first wiring layer 23*a*, the PWTAP second wiring layer 23*b*, and the PWTAP electrode 22 are connected by a PWTAP connection wiring layer 25. The PWTAP connection wiring layer 25 is connected to the power supply potential VSS.

In the PMOS region 30, a PM electrode 32 is formed so as to straddle a substantially central part of each p-type fin 31. Although not shown in FIG. 18, the gate insulating film 17 is formed between the p-type fins 31 and the PM electrode 32. The PM first wiring layer 33a is formed between the PM electrode 32 and the NM first electrode 12a, and the PM second wiring layer 33b is formed between the PM electrode 32 and the NM third electrode 12c. The NM first electrode 12a is connected to the PM first wiring layer 33a via the PM connection wiring layer 34. The NM first electrode 12a connects the drain of the NMOS and the drain of the PMOS to each other. Accordingly, the semiconductor device 1D has a circuit configuration as shown in FIG. 17.

Thus, in the fifth embodiment, the PWTAP electrode 22 on the PWTAP region 20 is separated into the gate electrode of the PMOS and the gate electrode of the NMOS. The PWTAP electrode 22 is disposed only on the PWTAP region 20 and connected to the power supply. Also in this configuration, the congestion of lead-in metal wires for drain contact can be prevented and the area of the semiconductor device can be reduced.

Sixth Embodiment

Figure 19:
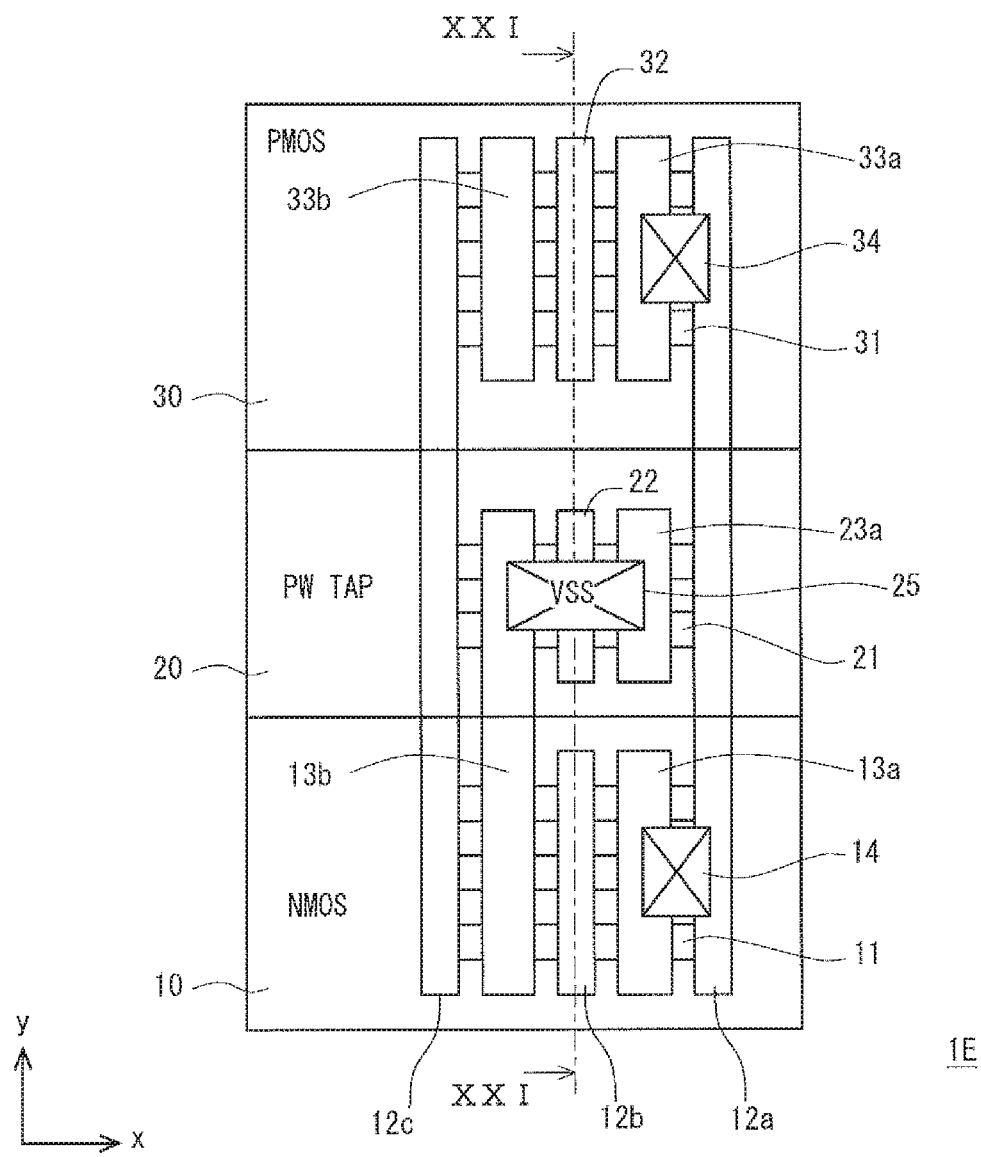
FIG. 19 is a plan view showing a configuration of a semiconductor device according to a sixth embodiment.
Figure 20:
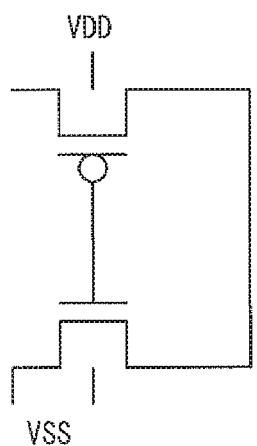
FIG. 20 is a circuit diagram showing the semiconductor device according to the sixth embodiment.
Figure 21:
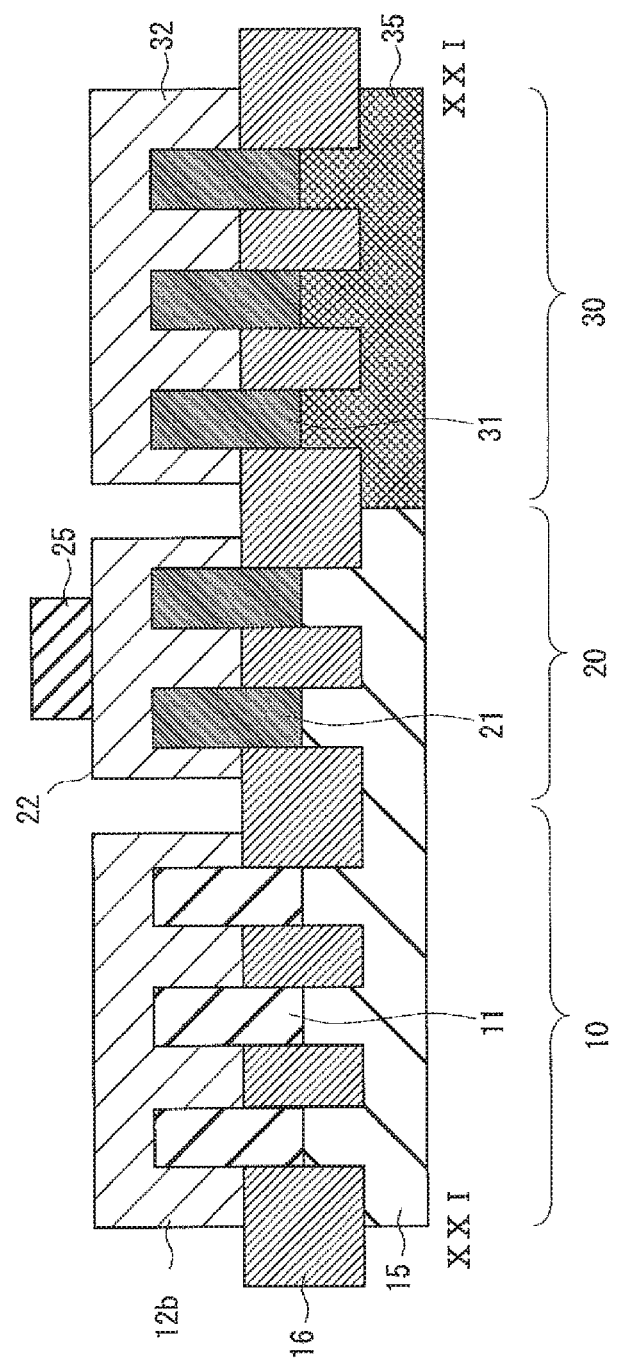
FIG. 21 is a sectional view taken along a line XXI-XXI of FIG. 19.

A semiconductor device 1E according to a sixth embodiment will be described with reference to FIGS. 19 to 21. FIG. 19 is a plan view showing the configuration of the semiconductor device 1E. FIG. 20 is a circuit diagram showing the semiconductor device 1E. FIG. 21 is a sectional view taken along a line XXI-XXI of FIG. 19. The semiconductor device 1E according to the sixth embodiment is a modified example of the semiconductor device 1D according to the fifth embodiment, and thus descriptions of the components of the sixth embodiment that are similar to those of the fifth embodiment are omitted.

As shown in FIG. 19, in the semiconductor device 1E, the NM second wiring layer 13b on the NMOS region 10 extends to the PWTAP region 20. Specifically, the source of the NMOS is connected to the power supply potential VSS by the metallic layer M0_V. The drain of the NMOS and the drain of the PMOS are connected by the NM first electrode 12a. Accordingly, the semiconductor device 1E has a circuit configuration shown in FIG. 20. Although the illustration of the element isolation film 16 and the gate insulating film 17 is omitted in the sectional view of FIG. 21, the gate insulating film 17 is formed on each of the n-type fins 11, the p-type fins 21, and the p-type fins 31, like in the embodiments described above.

Thus, the metallic layers M0_V in each region may be connected to each other, as long as the metallic layers M0_V are not connected to different power supplies. Also in the first to fifth embodiments, the metallic layers M0_V in each region may be connected to each other.

Seventh Embodiment

Figure 22:
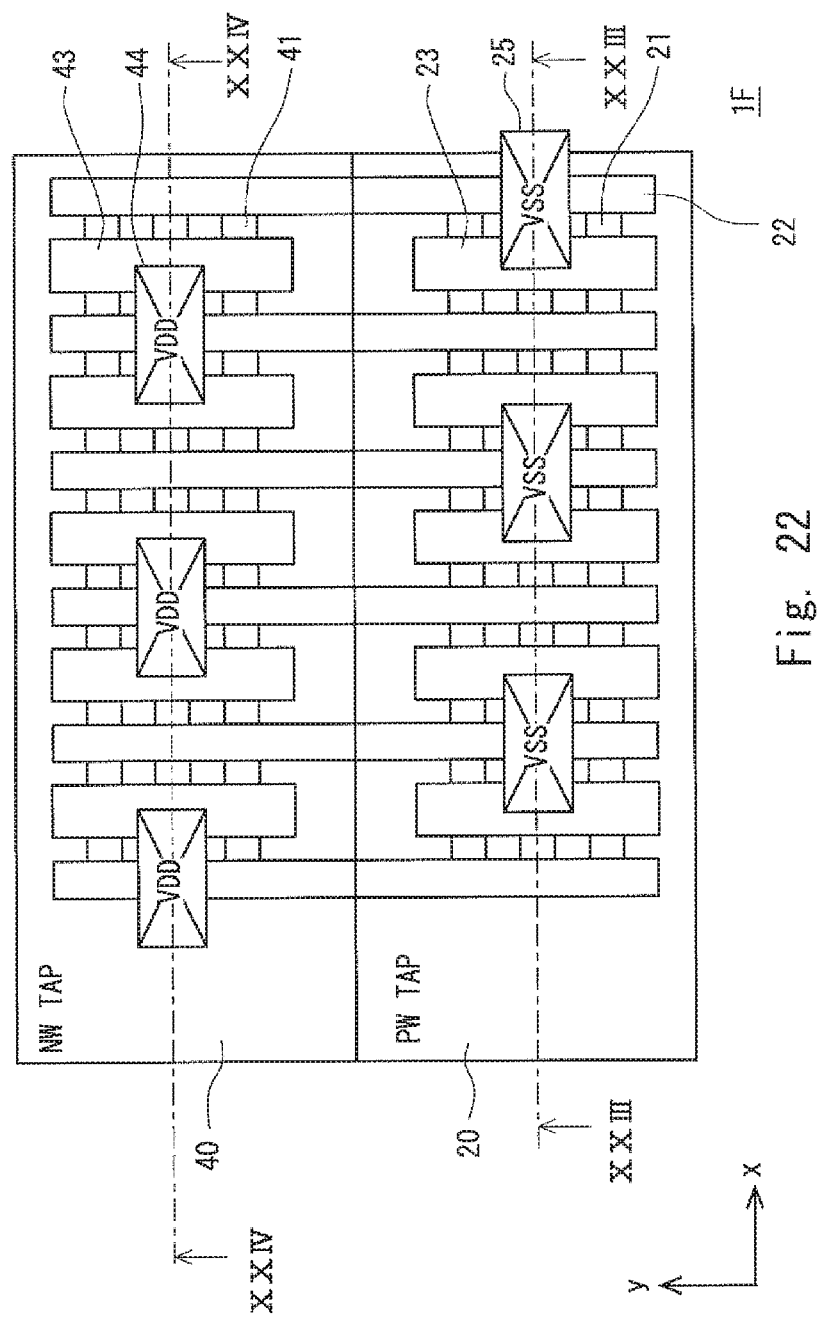
FIG. 22 is a plan view showing a configuration of a semiconductor device according to a seventh embodiment.
Figure 23:
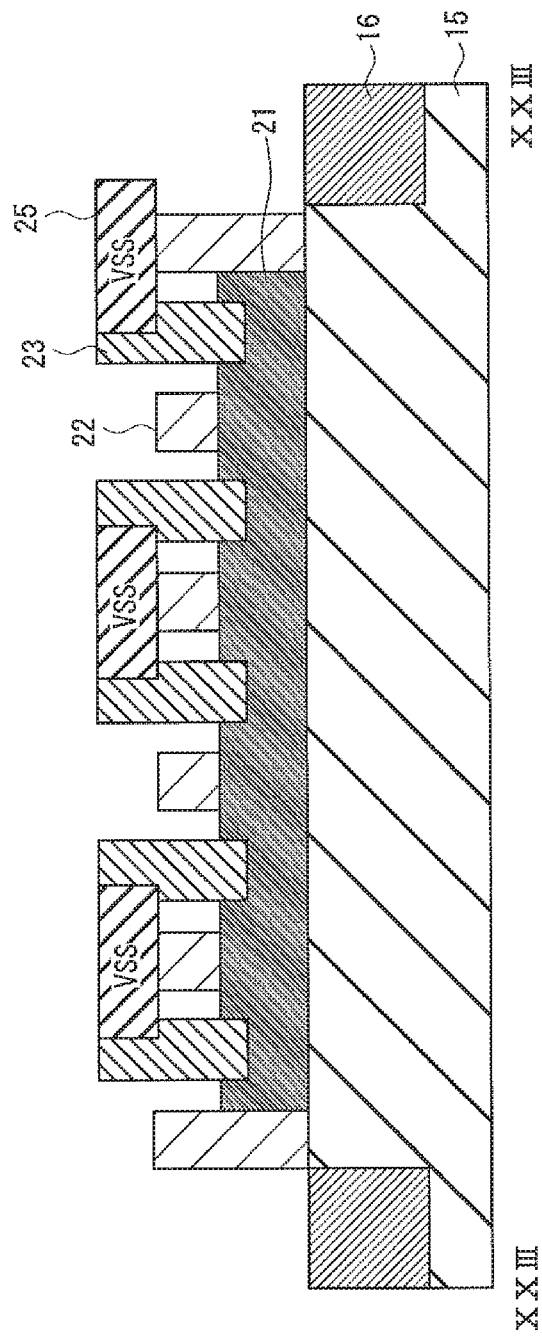
FIG. 23 is a view along an arrow direction from a line XXIII-XXIII of FIG. 22.
Figure 24:
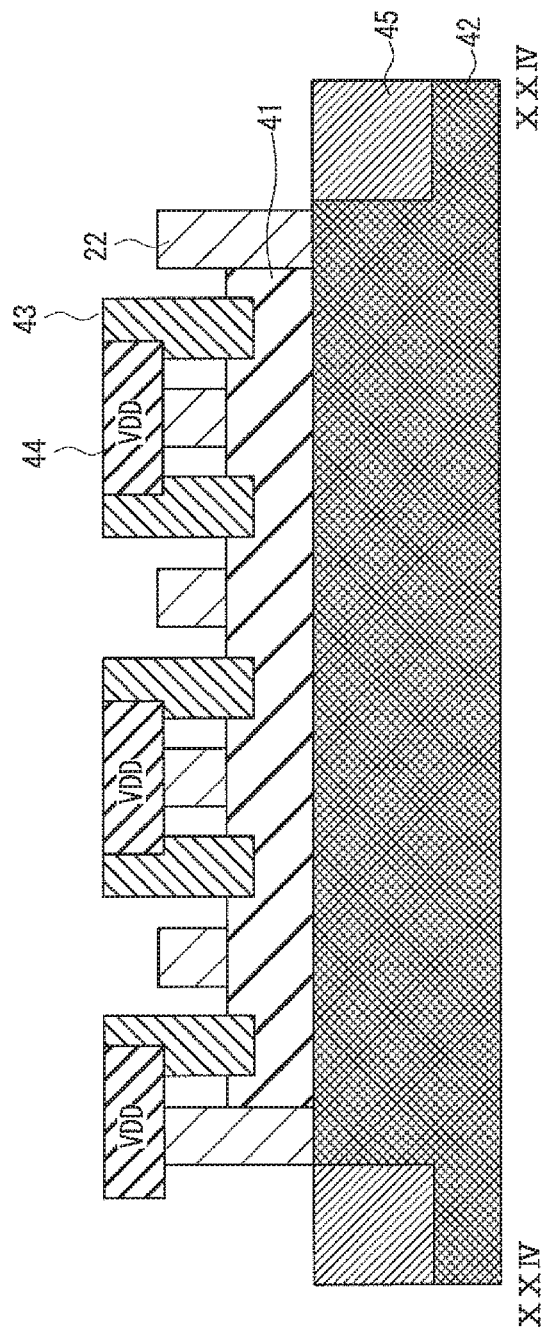
FIG. 24 is a view along an arrow direction from a line XXIV-XXIV of FIG. 22.

A semiconductor device 1F according to a seventh embodiment will be described with reference to FIGS. 22 to 24. FIG. 22 is a plan view showing the configuration of the semiconductor device 1F. FIG. 23 is a view along an arrow direction from a line XXIII-XXIII of FIG. 22. FIG. 24 is a view along an arrow direction from a line XXIV-XXIV of FIG. 22.

As shown in FIG. 22, the semiconductor device 1F includes the PWTAP region 20 and an NWTAP region 40 and does not include any transistor. The PWTAP region 20 and the NWTAP region 40 are disposed so as to face each other. As shown in FIG. 23, in the PWTAP region 20, the p-type well region 15 is formed on the semiconductor substrate. As shown in FIG. 24, in the NWTAP region 40, an n-type well region 42 is formed on the semiconductor substrate. Thus, in the seventh embodiment, the well region formed in the PWTAP region 20 and the well region formed in the NWTAP region 40 have different conductivity types.

The element isolation film 16 and an element isolation film 45, which define active regions, are formed in the p-type well region 15 and the n-type well region 42, respectively. In the PWTAP region 20, the p-type fins 21 are provided on the p-type well region 15. In the example shown in FIG. 22, three p-type fins 21 extending in the x-direction are formed side by side at predetermined intervals in the y-direction. The p-type fins 21 and the p-type well region 15 have the same conductivity type. In the NWTAP region 40, n-type fins 41 are provided on the n-type well region 42. In the example shown in FIG. 22, three n-type fins 41 extending in the x-direction are formed side by side at predetermined intervals in the y-direction. The n-type fins 41 and the n-type well region 42 have the same conductivity type.

On each p-type fin 21, six PWTAP electrodes 22 are formed. Each of the PWTAP electrodes 22 extends in the y-direction perpendicular to the x-direction and intersects with three p-type fins 21. Each of the PWTAP electrodes 22 is formed so as to straddle the p-type fins 21 as described above with reference to FIG. 3. Although not shown in FIG. 23, the gate insulating film 17 is formed on the entire lower surface of the PWTAP electrodes 22 so as to cover the p-type fins 21.

The six PWTAP electrodes 22 extend from the PWTAP region 20 to the NWTAP region 40. Each PWTAP electrode 22 is disposed so as to straddle the n-type fins 41. Although not shown in FIG. 24, the gate insulating film 17 is formed on the entire lower surface of the PWTAP electrodes 22 so as to cover the n-type fin 41. Accordingly, the gate insulating film 17 is formed among the p-type fins 21, the n-type fins 41, and the PWTAP electrodes 22.

The PWTAP electrodes 22 disposed at both ends of the six PWTAP electrodes 22 are formed so as to cover an end of each p-type fin 21 and an end of each n-type fin 41. Like in FIGS. 4 and 25, an end of each p-type fin 21 and an end of each n-type fin 41 can be disposed within a range from the inner end of each of the PWTAP first electrode 22a and the PWTAP second electrode 22b to the outer end thereof.

In the PWTAP region 20, the PWTAP wiring layer 23 is formed between the PWTAP electrodes 22. The PWTAP wiring layer 23 is formed of the above-mentioned metallic layer M0_V. On the p-type fin 21 disposed at the center, the PWTAP connection wiring layer 25 is formed on the PWTAP electrodes 22 which are located at the first, third, and fifth positions from the right side. The PWTAP connection wiring layer 25 is connected to the power supply potential VSS. The PWTAP connection wiring layer 25 is formed of the above-mentioned metallic layer M0_H. Each p-type fin 21 supplies the p-type well region 15 with the power supply potential VSS, and the p-type well region 15 is fixed at a certain potential.

Further, in the NWTAP region 40, an NWTAP wiring layer 43 is formed between the PWTAP electrodes 22. The NWTAP wiring layer 43 is also formed of the above-mentioned metallic layer M0_V. On the n-type fin 41 disposed at the center, an NWTAP connection wiring layer 44 is formed on the PWTAP electrodes 22 which are located at second, fourth, and sixth positions from the right side. The NWTAP connection wiring layer 44 is connected to the power supply potential VDD. The n-type well region 42 supplies the n-type well region 42 with the power supply potential VDD, and the n-type well region 42 is fixed at a certain potential. The NWTAP connection wiring layer 44 is also formed of the above-mentioned metallic layer M0_H.

Thus, in the seventh embodiment, the PWTAP connection wiring layer 25 connected to the power supply potential VSS and the NWTAP connection wiring layer 44 connected to the power supply potential VDD are alternately disposed on the PWTAP electrodes 22. This configuration enables formation of a varactor element for VDD/VSS with the same TAP area. Consequently, the decoupling capacity can be increased and the stability of the power supply can be increased.

The invention made by the present inventor has been described in detail above based on the embodiments. However, the present disclosure is not limited to the above embodiments and can be modified in various ways without departing from the scope of the invention.

Supplementary Note 1

A semiconductor device including:
a semiconductor substrate;
a first well formed on the semiconductor substrate;
a second well formed on the semiconductor substrate;
a first fin formed on the first well;
a second fin formed on the second well; and
a first electrode connected to each of the first fin and the second fin, in which
the first well and the first fin have the same conductivity type, and the second well and the second fin have different conductivity types.

Supplementary Note 2

The semiconductor device according to Supplementary Note 1, in which the first well and the second well have the same conductivity type.

Supplementary Note 3

The semiconductor device according to Supplementary Note 1, in which the first well and the second well have different conductivity types.

Supplementary Note 4

The semiconductor device according to Supplementary Note 1, further including:
a third fin formed on the second well; and
a second electrode connected to each of the second fin and the third fin.

Supplementary Note 5

The semiconductor device according to Supplementary Note 4, in which the second electrode is also connected to the first fin.

Supplementary Note 6

The semiconductor device according to Supplementary Note 4, further including a third electrode connected to each of the second fin and the third fin and formed between the first electrode and the second electrode in a plan view.

Supplementary Note 7

The semiconductor device according to Supplementary Note 6, in which the third electrode is also connected to the first fin.

Supplementary Note 8

The semiconductor device according to Supplementary Note 1, further including:
a third fin formed on the first well; and
a second electrode connected to each of the first fin and the third fin.

Supplementary Note 9

The semiconductor device according to Supplementary Note 8, in which the second electrode is also connected to the second fin.

Supplementary Note 10

The semiconductor device according to Supplementary Note 8, further including a third electrode connected to each of the first fin and the third fin and formed between the first electrode and the second electrode in a plan view.

Supplementary Note 11

The semiconductor device according to Supplementary Note 10, in which the third electrode is also connected to the second fin.

Supplementary Note 12

The semiconductor device according to Supplementary Note 10, in which the third electrode is also connected to a first potential.

Supplementary Note 13

A semiconductor device including:
a semiconductor substrate;
a first well formed on the semiconductor substrate;
a second well formed on the semiconductor substrate;
a first fin-type transistor formed in the first well; and
a fin formed in the second well, in which
an electrode of the first fin-type transistor is connected to the fin formed in the second well,
the first well and the first fin-type transistor have different conductivity types, and
the second well and the fin have the same conductivity type.

Supplementary Note 14

A semiconductor device including:
a semiconductor substrate;
a first well formed on the semiconductor substrate;
a second well formed on the semiconductor substrate;
a first fin formed on the first well;
a second fin formed on the second well; and
a first electrode connected to each of the first fin and the second fin, in which the first well and the first fin have the same conductivity type, the second well and the second fin have the same conductivity type, and the first well and the second well have different conductivity types.

Supplementary Note 15

A semiconductor device including:
a semiconductor substrate;
a first-conductivity-type well formed on the semiconductor substrate;
a first-conductivity-type first fin formed on the first-conductivity-type well;
a first-conductivity-type second fin formed on the first-conductivity-type well;
a second-conductivity-type third fin formed on the first-conductivity-type well;
a first electrode connected to each of the first fin and the second fin; and
a second electrode connected to each of the first fin and the third fin.

Supplementary Note 16

A semiconductor device including:
a semiconductor substrate;
a first-conductivity-type well formed on the semiconductor substrate;
a second-conductivity-type well formed on the semiconductor substrate;
a first-conductivity-type first fin formed on the first-conductivity-type well;
a first-conductivity-type second fin formed on the first-conductivity-type well;
a first-conductivity-type third fin formed on the second-conductivity-type well;
a first electrode connected to each of the first fin and the second fin; and
a second electrode connected to each of the first fin and the third fin.

Supplementary Note 17

The semiconductor device according to Supplementary Note 4, in which the first electrode is also connected to the third fin.

Supplementary Note 18

The semiconductor device according to Supplementary Note 8, in which the first electrode is also connected to the third fin.

REFERENCE SIGNS LIST

1 SEMICONDUCTOR DEVICE
1A to 1F SEMICONDUCTOR DEVICE
10 NMOS REGION
11 N-TYPE FIN
12a NM FIRST ELECTRODE
12b NM SECOND ELECTRODE
12c NM THIRD ELECTRODE
12d NM FOURTH ELECTRODE
13a NM FIRST WIRING LAYER
13b NM SECOND WIRING LAYER
14 NM CONNECTION WIRING LAYER
15 P-TYPE WELL REGION
16 ELEMENT ISOLATION FILM
17 GATE INSULATING FILM
20 PWTAP REGION
21 P-TYPE FIN
22 PWTAP ELECTRODE
22a PWTAP FIRST ELECTRODE
22b PWTAP SECOND ELECTRODE
23 PWTAP WIRING LAYER
23a PWTAP FIRST WIRING LAYER
23b PWTAP SECOND WIRING LAYER
24 GATE CONTACT
25 PWTAP CONNECTION WIRING LAYER
30 PMOS REGION
31 P-TYPE FIN
32 PM ELECTRODE
33a PM FIRST WIRING LAYER
33b PM SECOND WIRING LAYER
34 PM CONNECTION WIRING LAYER
35 N-TYPE WELL REGION
40 NWTAP REGION
41 N-TYPE FIN
42 N-TYPE WELL REGION
43 NWTAP WIRING LAYER
44 NWTAP CONNECTION WIRING LAYER
45 ELEMENT ISOLATION FILM

The inventiion claimed is:

1. A semiconductor device comprising:
a semiconductor substrate;
a first well region formed on the semiconductor substrate;
a first fin integrally formed of the semiconductor substrate on the first well region and extended in a first direction in a plan view;
a first electrode formed on the first fin via a first gate insulating film, and extended in a second direction crossing the first direction in the plan view;
a tap region formed on the semiconductor substrate adjacent to the first well region in the second direction, and supplying a first potential to the first well region;
a second fin integrally formed of the semiconductor substrate on the tap region and extended in the first direction in the plan view; and
a first wiring layer formed on the second fin in a portion overlapping the tap region in the plan view, extended in the second direction, and supplying the first potential to the first well region via the second fin and the tap region,
wherein the first electrode is formed on the second fin via a second gate insulating film.

2. The semiconductor device according to claim 1, further comprising:
a second well region formed on the semiconductor substrate on an opposite side of the first well region to the tap region in the second direction,
a third fin integrally formed of the semiconductor substrate on the second well region and extended in the first direction in the plan view,
wherein the first electrode is formed on the third fin via a third insulating film in the plan view.

3. The semiconductor device according to claim 2, wherein the first well region, the second well region, and the tap region have first conductivity type,
wherein the first fin has second conductivity type different from the first conductivity type,
wherein the third fin has the second conductivity type, wherein a first source region and a first drain region of a first field effect transistor are formed in the first fin, wherein a second source region and a second drain region of a second field effect transistor are formed in the third fin, wherein the first electrode is connected to either one of the first source region or the first drain region, and either one of the second source region or the second drain region.

4. The semiconductor device according to claim 2, wherein the first well region and the tap region have first conductivity type, wherein the first fin has second conductivity type different from the first conductivity type, wherein the third fin has the first conductivity type, and wherein the second well region has the second conductivity type.

5. The semiconductor device according to claim 4, wherein a first source region and a first drain region of a first field effect transistor are formed in the first fin, wherein a second source region and a second drain region of a second field effect transistor are formed in the second fin, and wherein the first electrode is connected to either one of the first source region or the first drain region, and either one of the second source region or the second drain region.

6. The semiconductor device according to claim 2, wherein a first source region and a first drain region of a first field effect transistor are formed in the first fin, wherein a second source region and a second drain region of a second field effect transistor are formed in the third fin, and wherein a first gate electrode of the first field effect transistor and a second gate electrode of the second field effect transistor are formed of the first electrode.

7. The semiconductor device according to claim 1, wherein the first electrode are formed to cover an end of the second fin on the tap region.

8. The semiconductor device according to claim 2, further comprising a second electrode formed on the first fin, the second fin, and the third fin via a fourth gate insulating film, a fifth gate insulating film, and a sixth gate insulating film, respectively, and extended in the second direction, wherein the second electrode is formed to cover an end of the first fin, an end of the second fin, and an end of the third fin via a seventh gate insulating film, an eighth gate insulating film, and a ninth gate insulating film.

9. The semiconductor device according to claim 8, further comprising a second wiring layer extended in the second direction and disposed on the second fin and the third fin, wherein the first well region and the tap region have first conductivity type, wherein the first fin has a second conductivity type different from the first conductivity type, wherein the third fin has the first conductivity type, wherein the second well region has the second conductivity type, wherein a first source region and a first drain region of a first field effect transistor are formed in the first fin, wherein a second source region and a second drain region of a second field effect transistor are formed in the third fin, and wherein the second wiring layer is formed on either one of the second source region or the second drain region, and electrically connected to either one of the second source region or the second drain region.

10. A semiconductor device comprising:

a semiconductor substrate;

a first tap region having a first conductivity type disposed in the semiconductor substrate;

a second tap region having a second conductivity type different from the first conductivity type, and disposed adjacent to the first tap region in a first direction in plan view;

a first fin integrally formed of the semiconductor substrate on the first tap region and extended in a second direction crossing the first direction in a plan view;

a second fin integrally formed of the semiconductor substrate on the second tap region and extended in the second direction;

a first electrode formed on the first fin and the second fin via a first gate insulating film and a second gate insulating film respectively, and extended in the first direction;

a second electrode different from the first electrode, formed on the first fin and the second fin via a third gate insulating film and a fourth gate insulating film respectively, and extended in the first direction;

a first connection wiring layer formed on the first electrode and supplying a first potential to the first electrode;

a second connection wiring layer formed on the second electrode and supplying a second potential different from the first potential to the second electrode;

a first wiring layer formed between the first electrode and the second electrode in the second direction on the first tap region and extended in the first direction; and a second wiring layer disposed between the first electrode and the second electrode in the second direction on the second tap region and extended in the first direction.

* * * * *